United States Patent
Ito et al.

(10) Patent No.: US 9,634,203 B2
(45) Date of Patent: Apr. 25, 2017

(54) LIGHT EMITTING DEVICE, SURFACE LIGHT SOURCE, LIQUID CRYSTAL DISPLAY DEVICE, AND METHOD FOR MANUFACTURING LIGHT EMITTING DEVICE

(75) Inventors: Shin Ito, Osaka (JP); Yutaka Okada, Osaka (JP); Takanobu Matsuo, Osaka (JP); Masayuki Ohta, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 476 days.

(21) Appl. No.: 12/995,364

(22) PCT Filed: May 29, 2009

(86) PCT No.: PCT/JP2009/059863
§ 371 (c)(1),
(2), (4) Date: Nov. 30, 2010

(87) PCT Pub. No.: WO2009/145298
PCT Pub. Date: Dec. 3, 2009

(65) Prior Publication Data
US 2011/0085352 A1    Apr. 14, 2011

(30) Foreign Application Priority Data

May 30, 2008 (JP) .................................. 2008-142697
Jan. 21, 2009 (JP) .................................. 2009-011192

(51) Int. Cl.
*F21V 7/04*    (2006.01)
*H01L 33/54*    (2010.01)
(Continued)

(52) U.S. Cl.
CPC .............. *H01L 33/54* (2013.01); *H01L 33/50* (2013.01); *G02B 6/0055* (2013.01);
(Continued)

(58) Field of Classification Search
CPC .... G02B 1/00; G02B 2207/00; G02B 6/0055; G02B 6/0068; G02B 6/0073; H01L 33/54;
(Continued)

(56) References Cited

U.S. PATENT DOCUMENTS 6,734,466 B2    5/2004   Chua
7,365,371 B2*   4/2008   Andrews ................. H01L 33/52
                                                      257/100
(Continued)

FOREIGN PATENT DOCUMENTS

JP    2003-286480    10/2003
JP    2006-519500    8/2006
(Continued)

OTHER PUBLICATIONS

International Search Report for PCT/JP2009/059863, mailed Sep. 1, 2009.
LUXEON Rebel Reliability Database RD07, (Nov. 2007), pp. 1-12.

*Primary Examiner* — Andrew Coughlin
*Assistant Examiner* — Jessica M Apenteng
(74) *Attorney, Agent, or Firm* — Nixon & Vanderhye P.C.

(57) ABSTRACT

A light emitting device includes: a substrate having a main surface; a phosphor layer provided on the main surface and containing an LED element that emits primary light and a fluorescent particle that absorbs a part of the primary light and emits secondary light; and a transparent resin layer having a refractive index n and covering the phosphor layer. The transparent resin layer has an outer circumferential surface that forms a boundary between the transparent resin layer and the atmosphere. When a minimum circumference that includes the overall phosphor layer and is concentric with the outer circumferential surface has a radius r in a cut surface where at least a part of the outer circumferential surface takes a shape of an arc having a radius R, a (Continued)

relationship of R>r·n is satisfied. With such configuration, the light extraction efficiency is enhanced.

15 Claims, 17 Drawing Sheets

(51) Int. Cl.
*H01L 33/50* (2010.01)
*F21V 8/00* (2006.01)

(52) U.S. Cl.
CPC .......... *G02B 6/0068* (2013.01); *G02B 6/0073* (2013.01); *H01L 2224/48091* (2013.01); *H01L 2224/48137* (2013.01); *H01L 2924/0002* (2013.01)

(58) Field of Classification Search
CPC ........... H01L 33/50; H01L 2224/48091; H01L 2224/48137
USPC ................. 362/561, 84, 97.1–97.4, 600–634
See application file for complete search history.

(56) References Cited

U.S. PATENT DOCUMENTS

| | | | | |
|---|---|---|---|---|
| 2005/0093430 A1* | 5/2005 | Ibbetson et al. | ............. | 313/501 |
| 2007/0147081 A1* | 6/2007 | Choi | ............. | 362/612 |
| 2007/0194691 A1 | 8/2007 | Choo et al. | | |
| 2007/0228390 A1* | 10/2007 | Hattori et al. | ............. | 257/79 |
| 2008/0007939 A1* | 1/2008 | Lee et al. | ............. | 362/97 |
| 2008/0023711 A1 | 1/2008 | Tarsa et al. | | |
| 2008/0026498 A1 | 1/2008 | Tarsa et al. | | |
| 2008/0170413 A1* | 7/2008 | Beeson et al. | ............. | 362/612 |
| 2009/0321758 A1* | 12/2009 | Liu et al. | ............. | 257/98 |
| 2010/0308356 A1 | 12/2010 | Wirth | | |

FOREIGN PATENT DOCUMENTS

| | | |
|---|---|---|
| JP | 2006-351809 | 12/2006 |
| JP | 3900144 | 1/2007 |
| JP | 2007-201301 | 8/2007 |
| JP | 2007-273562 | 10/2007 |
| JP | 2007-306036 A | 11/2007 |
| JP | 2008-34806 A | 2/2008 |
| JP | 2008-47851 A | 2/2008 |
| JP | 2008-124267 A | 5/2008 |
| WO | WO 2004/077580 | 9/2004 |
| WO | WO 2008/023605 A1 | 2/2008 |
| WO | WO 2009/039826 A1 | 4/2009 |

* cited by examiner

B-B' CROSS SECTION

C-C' CROSS SECTION

B-B' CROSS SECTION

C-C' CROSS SECTION

B-B' CROSS SECTION

LIGHT EMITTING DEVICE, SURFACE LIGHT SOURCE, LIQUID CRYSTAL DISPLAY DEVICE, AND METHOD FOR MANUFACTURING LIGHT EMITTING DEVICE

This application is the U.S. national phase of International Application No. PCT/JP2009/059863 filed 29 May 2009 which designated the U.S. and claims priority to JP Application No. 2008-142697 filed 30 May 2008; and JP Application No. 2009-011192 filed 21 Jan. 2009, the entire contents of each of which are hereby incorporated by reference.

TECHNICAL FIELD

The present invention generally relates to a light emitting device, a surface light source, a liquid crystal display device, and a method for manufacturing a light emitting device. The present invention relates to an edge light type or a directly below type surface light source used as a backlight for a display device such as a liquid crystal television, a resin seal type light emitting device used in this surface light source, a liquid crystal display device using this surface light source, and a method for manufacturing a light emitting device.

BACKGROUND ART

As a conventional light emitting device, Japanese Patent Laying-Open No. 2006-351809 (Patent Document 1), for example, discloses a light emitting device designed to enhance the light use efficiency by extracting light emitted from a light emitting element chip without attenuating the light by a light extracting and increasing component. The light emitting device disclosed in Patent Document 1 has a light emitting element chip formed of a light emitting diode, and a light extracting and increasing component optically coupled to an emission surface of the light emitting element chip, for increasing the amount of light extracted from the light emitting element chip and controlling light distribution using refraction.

In addition, Japanese Patent Laying-Open No. 2003-286480 (Patent Document 2) discloses a fluorescent filler designed to enable production of an optical element such as a light emitting diode having enhanced light emission performance and reliability, and a method for forming the fluorescent filler. Patent Document 2 describes, as the prior art, an LED element having an LED chip, a drop covering the LED chip and including a mixture of a fluorescent compound particle and an epoxy, and a transparent optical dome covering the drop.

PRIOR ART DOCUMENTS

Patent Documents
Patent Document 1: Japanese Patent Laying-Open No. 2006-351809
Patent Document 2: Japanese Patent Laying-Open No. 2003-286480

SUMMARY OF THE INVENTION

Problems to be Solved by the Invention

With recent technological advance, there has been a strong demand for reducing the thickness and weight of a large display device exceeding 50 inches diagonally, for example. Therefore, there has also been a demand for reducing the thickness and weight of an edge light type surface lighting device used as a backlight for the display device. In response to these demands, a light emitting device that uses a light guide plate having a thickness of less than 3 mm, and a sealing resin in the shape of a hemispherical lens having a thickness of 1.45 mm or less, and further 1 mm or less, and corresponding to this light guide plate is specifically required. On the other hand, because of a request for brightness, an LED (light emitting diode) element used in the light emitting device has been increasing in size, and specifically, the use of an LED element having a size of approximately 0.3 mm or more has begun. In addition, there has also been a demand for reducing the thickness and weight of a directly below type surface lighting device.

Moreover, in response to a request for color multiplication and whitening in the surface lighting device, a scheme of arranging red (R), green (G) and blue (B) LED elements side by side to newly create a desired color or a scheme of exciting a phosphor with short-wavelength light emitted from an LED element and producing secondary light to create a desired color has been used.

In accordance with such trend to reduce the thickness and weight, the sealing resin has decreased in size, whereas the LED element has increased in size, and as a result, the size of the sealing resin is nearly equal to the size of the LED element in terms of the order. Under such conditions, light cannot be extracted sufficiently from the sealing resin by using a conventional method in which the LED element is treated as a point light source. In addition, when the phosphor is used as a light source for the secondary light, a region of a light emitting body to be considered expands from only the LED element to a wide region including the LED element and the phosphor. In this case as well, light cannot be extracted sufficiently from the sealing resin by using the conventional method.

Thus, in order to solve the above problems, an object of the present invention is to provide a light emitting device having enhanced light extraction efficiency, a surface light source, a liquid crystal display device, and a method for manufacturing a light emitting device.

Means for Solving the Problems

A light emitting device of the present invention includes: a substrate having a main surface; an inner portion provided on the main surface and containing a semiconductor light emitting element that emits primary light and a fluorescent particle that absorbs a part of the primary light and emits secondary light; and an outer portion having a refractive index n and covering the inner portion. The outer portion has an outer circumferential surface that forms a boundary between the outer portion and the atmosphere. When a minimum circumference that includes the overall inner portion and is concentric with the outer circumferential surface has a radius r in a cut surface where at least a part of the outer circumferential surface takes a shape of an arc having a radius R, a relationship of R>r·n is satisfied.

In the light emitting device of the present invention, the inner portion preferably contains a plurality of semiconductor light emitting elements.

The light emitting device of the present invention preferably further includes a scattered particle dispersed in the inner portion, for scattering the primary light and the secondary light.

In the light emitting device of the present invention, the outer portion and the inner portion are preferably formed in a shape of concentric hemispheres having radius R and radius r (r<R/n), respectively.

In the light emitting device of the present invention, the outer portion and the inner portion are preferably formed in a shape of concentric semicircles having radius R and radius r (r<R/n) in the cut surface, respectively, and the outer circumferential surface of the outer portion preferably has a shape of a semicircular column.

In the light emitting device of the present invention, a center of the outer circumferential surface and the circumference is preferably arranged on the main surface or within the substrate.

In the light emitting device of the present invention, the inner portion preferably has any one of a rectangular parallelepiped shape, a columnar shape and a polygonal columnar shape.

In the light emitting device of the present invention, when the inner portion has a refractive index n', a relationship of n<n' is preferably satisfied.

In the light emitting device of the present invention, the inner portion is preferably formed of a transparent resin or glass.

In the light emitting device of the present invention, the outer portion is preferably formed of a transparent resin or glass.

The light emitting device of the present invention preferably further includes a blocking component provided at a boundary portion between the inner portion and the outer portion on the main surface.

A surface light source of the present invention includes: a line light source having a plurality of above-described light emitting devices arranged in a straight line; and a light guide plate having an emission surface that extends in a planar shape and an incidence end surface that extends in a thickness direction of the light guide plate from a periphery of the emission surface and on which light emitted from the line light source is incident. Upon reception of the light incident on the incidence end surface, light is emitted from the emission surface.

A surface light source of the present invention includes a plurality of above-described light emitting devices arranged in a planar shape.

A liquid crystal display device of the present invention includes: the above-described surface light source; and a liquid crystal display panel arranged to face the surface light source and irradiated from a rear surface by the surface light source.

A method for manufacturing a light emitting device of the present invention includes the steps of die-bonding a semiconductor light emitting element onto a substrate; providing a blocking component on the substrate to surround the semiconductor light emitting element; forming a resin including a fluorescent particle inside the blocking component and covering the semiconductor light emitting element with the resin including the fluorescent particle; and covering the resin including the fluorescent particle with a transparent resin.

In the method for manufacturing a light emitting device of the present invention, a cross section of the blocking component preferably has an inclined surface on a side where the blocking component faces the semiconductor light emitting element.

The method for manufacturing a light emitting device of the present invention preferably further includes the step of removing the blocking component between the step of covering the semiconductor light emitting element with the resin including the fluorescent particle and the step of covering the resin including the fluorescent particle with a transparent resin.

Effects of the Invention

As explained above, according to the present invention, there can be provided a light emitting device having enhanced light extraction efficiency, a surface light source, a liquid crystal display device, and a method for manufacturing a light emitting device.

In addition, an increase in size of a sealing resin can be suppressed even when the light emitting device includes a plurality of LED elements.

MODES FOR CARRYING OUT THE INVENTION

Figure 1:
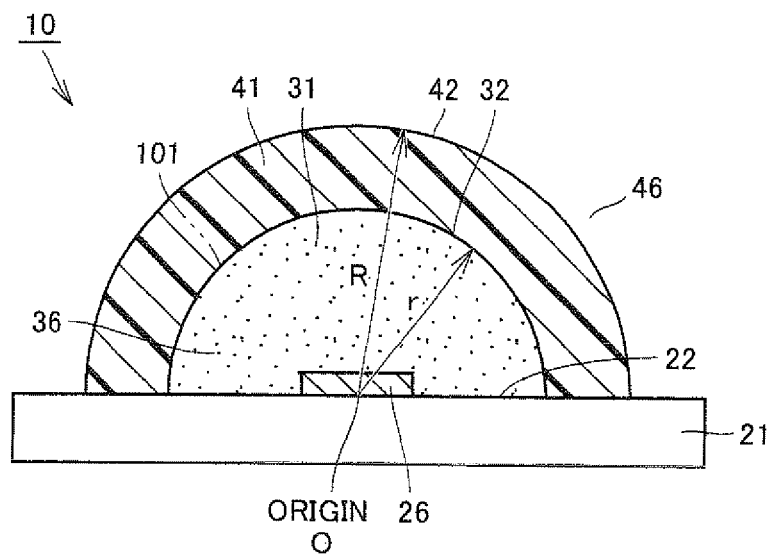
FIG. 1 is a cross-sectional view of a light emitting device in a first embodiment of the present invention.

Embodiments of the present invention will be described with reference to the drawings. In the drawings referenced below, the same or corresponding components are denoted with the same numbers.

First Embodiment

Figure 2:
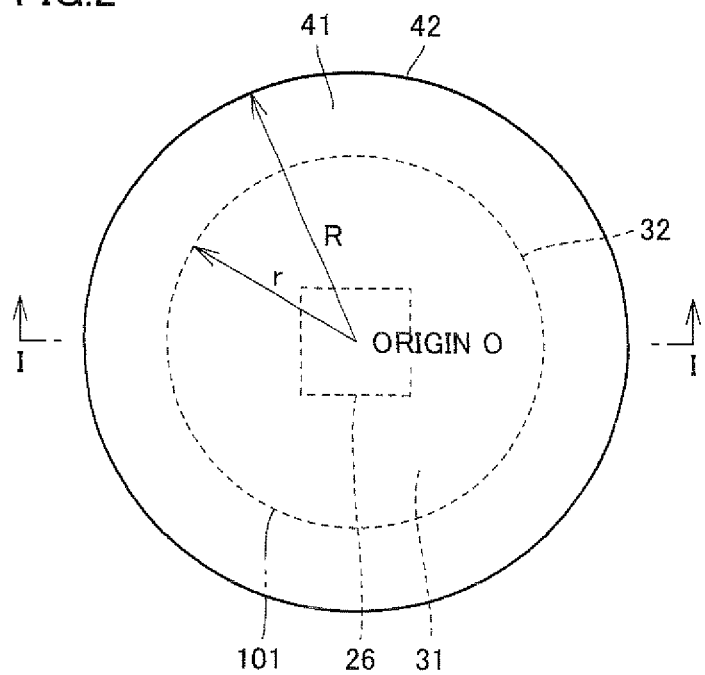
FIG. 2 is a plan view of the light emitting device in FIG. 1.

FIG. 1 is a cross-sectional view of a light emitting device in a first embodiment of the present invention. FIG. 2 is a plan view of the light emitting device in FIG. 1. FIG. 1 illustrates a cross section taken along line I-I in FIG. 2.

Referring to FIGS. 1 and 2, a light emitting device 10 in the present embodiment is configured to have a substrate 21, an LED element 26, a phosphor layer 31, and a transparent resin layer 41.

Substrate 21 has a main surface 22 extending in the planar shape. LED element 26 is provided on main surface 22. Although not shown, LED element 26 is physically and electrically connected to substrate 21 by using, for example, a die bond paste and a wire. LED element 26 emits any of red (R), green (G) and blue (B) lights. LED element 26 has a size of 0.3 mm or more as one example. LED element 26 is formed of GaN, sapphire, GaAs, AlGaInP or the like, depending on the emitted light color.

Phosphor layer 31 serving as an inner portion is provided on main surface 22 to surround LED element 26. Transparent resin layer 41 serving as an outer portion is provided to further cover phosphor layer 31. Phosphor layer 31 is provided to completely fill a space between LED element 26 and transparent resin layer 41 on main surface 22. An atmospheric layer 46 is present around transparent resin layer 41. In other words, phosphor layer 31, transparent resin layer 41 and atmospheric layer 46 are arranged around LED element 26 from the inside to the outside.

Phosphor layer 31 and transparent resin layer 41 are provided as a sealing resin of LED element 26. Phosphor layer 31 and transparent resin layer 41 are formed in the shape of concentric hemispheres having a radius r and a radius R, respectively, with an origin O being the center. Origin O is arranged on main surface 22. LED element 26 is arranged in a position where LED element 26 overlies origin O.

In such configuration, transparent resin layer 41 has an outer circumferential surface 42 of radius R. Outer circumferential surface 42 is formed in the shape of a spherical surface with origin O being the center. Outer circumferential surface 42 is a surface that forms a boundary between transparent resin layer 41 and atmospheric layer 46. Phosphor layer 31 has an outer circumferential surface 32 of radius r. Outer circumferential surface 32 is formed in the shape of a spherical surface with origin O being the center. Outer circumferential surface 32 is a surface that forms a boundary between phosphor layer 31 and transparent resin layer 41.

In the cross section shown in FIG. 1 where outer circumferential surface 42 takes the shape of an arc having radius R, a minimum circumference 101 that includes overall phosphor layer 31 and is concentric with outer circumferential surface 42 (with origin O being the center) is defined. Circumference 101 has radius r. In the present embodiment, since transparent resin layer 41 and phosphor layer 31 are formed in the shape of a concentric hemisphere, circumference 101 matches outer circumferential surface 32.

Phosphor layer 31 is formed of a resin that allows light emitted from LED element 26 to pass. Phosphor layer 31 is formed of, for example, a transparent epoxy resin or silicone resin. A plurality of fluorescent particles 36 are dispersed in phosphor layer 31. The wavelength of light emitted from LED element 26 is converted by fluorescent particles 36, and as a result, light having a wavelength different from that of the light emitted from LED element 26 is emitted from phosphor layer 31.

It is noted that BOSE (Ba, O, Sr, Si, Eu) and the like, for example, can be suitably used as fluorescent particles 36. In addition to BOSE, SOSE (Sr, Ba, Si, O, Eu), YAG (Ce-activated yttrium aluminum garnet), α sialon ((Ca), Si, Al, O, N, Eu), β sialon (Si, Al, O, N, Eu) and the like can be suitably used. Although a blue light emitting element having a light emission peak wavelength of 450 nm is used as LED element 26, a ultraviolet (near-ultraviolet) LED element having a light emission peak wavelength of 390 to 420 nm, for example, can be used instead of the blue light emitting element, which allows further enhancement of the light emission efficiency.

Although the case where light emitting device 10 has phosphor layer 31 is described in the present embodiment, a light diffusing layer may be provided instead of phosphor layer 31. Scattered particles for scattering light emitted from LED element 26, which includes, for example, powders and the like of $TiO_2$, $SiO_2$, alumina, aluminum nitride, or mullite (the particle size is, for example, 10 nm to 10 μm) as ingredients, are dispersed in the light diffusing layer. In addition, mixed fluorescent particles and scattered particles may be used to suppress color unevenness.

Transparent resin layer 41 is formed of a resin that allows light emitted from LED element 26 and phosphor layer 31 to pass. Transparent resin layer 41 is formed of, for example, a transparent epoxy resin or silicone resin. Transparent resin layer 41 has a refractive index n. Preferably, phosphor layer 31 has a refractive index n' larger than refractive index n. In this case, by arranging phosphor layer 31 having a larger refractive index around LED element 26, the efficiency of extraction of light from LED element 26 can be enhanced.

In light emitting device 10, mixed light of primary light emitted from LED element 26 and secondary light emitted from phosphor layer 31 passes through transparent resin layer 41 and is extracted into atmospheric layer 46. At this time, by appropriately combining the color of the light emitted from LED element 26 and the color of the light emitted from phosphor layer 31, the color of the light extracted from light emitting device 10 can be freely selected.

The shape of phosphor layer 31 as well as the material and shape of transparent resin layer 41 are determined such that the relationship of R>r·n is established. With such configuration, light emitted within circumference 101 can be efficiently extracted into atmospheric layer 46. The reason for this will be described hereinafter.

Figure 3:
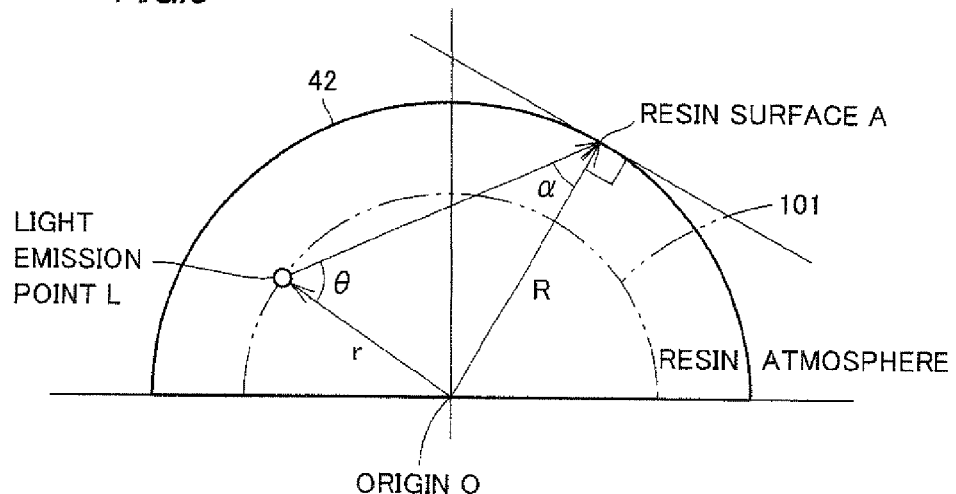
FIG. 3 schematically illustrates the light emitting device in FIG. 1 on a coordinate with an origin O being the center.

FIG. 3 schematically illustrates the light emitting device in FIG. 1 on a coordinate with origin O being the center. Referring to FIG. 3, on the coordinate with origin O being the center, a light emission point L is plotted in an arbitrary position on circumference 101, and a resin surface A is plotted in a position on outer circumferential surface 42 where light emitted from light emission point L is incident at an incidence angle α. An angle formed by a line segment connecting origin O and light emission point L and a line segment connecting light emission point L and resin surface A is defined as θ.

Here, the following relational expression is established according to the sine theorem.

$(R/\sin\theta)=(r/\sin\alpha)$

Arranging the above expression, the following expression is obtained.

$\sin\alpha=r\sin\theta/R$

According to this expression, when $\theta=\pi/2$, α takes a maximum value (α max).

In other words, the following (expression 1) is established.

$\sin\alpha \leq \sin(\alpha\ max)=r/R$ (expression 1)

According to the Snell's law, the following (expression 2) is established between incidence angle α and a critical angle θc of total reflection at the boundary between transparent resin layer 41 and atmospheric layer 46.

$\sin\theta c=1/n$ (expression 2)

Now, when the relationship of α<θc, that is, the following (expression 3) is constantly established in light emitting device 10, light emitted from light emission point L can all be extracted into atmospheric layer 46.

$\alpha\ max<\theta c$ (expression 3)

Arranging (expression 1) to (expression 3), the following relational expression is established.

$r/R=\sin(\alpha\ max)<\sin\theta c=1/n$

Consequently, by providing phosphor layer 31 and transparent resin layer 41 such that the relationship of R>r·n is established, light emitted from the inside to the outside of circumference 101 can all be extracted into atmospheric layer 46.

Figure 4:
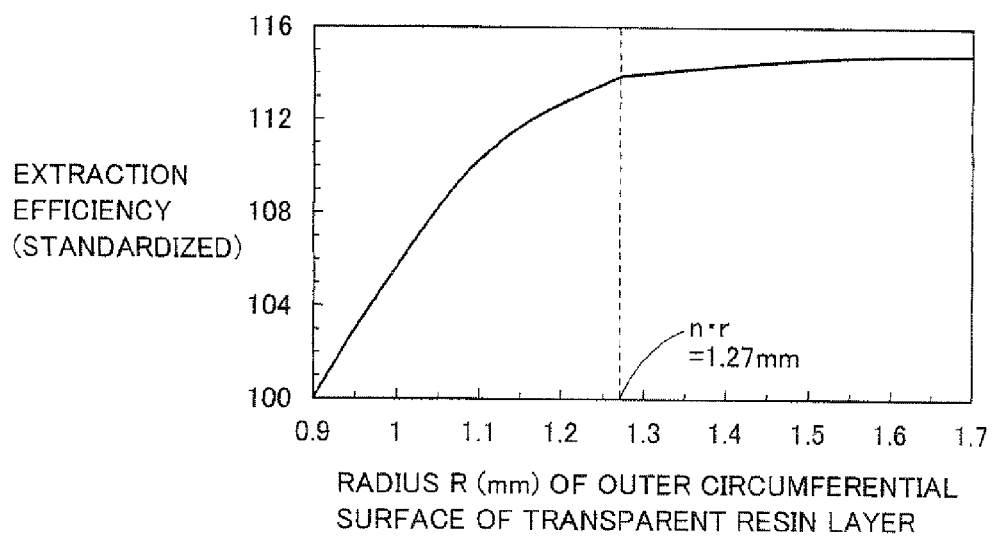
FIG. 4 is a graph showing the relationship between the radius of an outer circumferential surface of a transparent resin layer and the light extraction efficiency.

FIG. 4 is a graph showing the relationship between the radius of the outer circumferential surface of the transparent resin layer and the light extraction efficiency. Referring to FIG. 4, a simulation was carried out to check how the above relational expression of R>r·n affects the light extraction efficiency into atmospheric layer 46. In this simulation, radius r of circumference 101 and refractive index n of phosphor layer 31 were fixed to r=0.9 mm and n=1.41 (r·n=1.27 mm) and the relationship between radius R of outer circumferential surface 42 and the light extraction efficiency was determined. Assuming that a value of the light extraction efficiency was 100 when radius R=0.9 mm, the light extraction efficiency was standardized based on this value.

As can be seen from the graph, as radius R of outer circumferential surface 42 increased, the light extraction efficiency increased. The rate of increase in extraction efficiency was relatively high in the range of R≤1.27 mm where the light extraction efficiency was affected by total reflection, and was relatively low in the range of R>1.27 mm where the light extraction efficiency was not affected by total reflection. In addition, the value of the extraction efficiency was almost saturated near 114 to 115, From the above result, the following was able to be recognized: by optimizing the shape of phosphor layer 31 as well as the material and shape of transparent resin layer 41 in accordance with the relational expression of R>r·n, the light extraction efficiency was enhanced by approximately 14 to 15 percent at the maximum.

Light emitting device 10 in the first embodiment of the present invention includes substrate 21 having main surface 22, phosphor layer 31 provided on main surface 22 and serving as the inner portion that contains a base point of light emission, and transparent resin layer 41 having refractive index n and serving as the outer portion that covers phosphor layer 31. Transparent resin layer 41 has outer circumferential surface 42 that forms a boundary between transparent resin layer 41 and the atmosphere. When minimum circumference 101 that includes overall phosphor layer 31 and is concentric with outer circumferential surface 42 has radius r in a cut surface where at least a part of outer circumferential surface 42 takes the shape of the arc having radius R, the relationship of R>r·n is satisfied.

Light emitting device 10 further includes LED element 26 surrounded by phosphor layer 31 and serving as a semiconductor light emitting element that emits the primary light, and fluorescent particles 36 dispersed in phosphor layer 31, absorbing a part of the primary light and emitting the secondary light, and arranged at the above base point.

Although phosphor layer 31 and transparent resin layer 41 formed of a transparent resin are provided as the inner portion and the outer portion in the present embodiment, the configuration is not limited thereto. A light transparent glass layer formed of glass that allows light to pass may be provided, for example.

According to the light emitting device in the first embodiment of the present invention configured as described above, total reflection at the boundary between transparent resin layer 41 and atmospheric layer 46 as well as a light confinement phenomenon to the sealing resin due to this total reflection can be eliminated. In other words, light emitted from LED element 26 and phosphor layer 31 and traveling to transparent resin layer 41 can be extracted into atmospheric layer 46 without being reflected at the boundary between transparent resin layer 41 and atmospheric layer 46. As a result, the light extraction efficiency can be enhanced.

Second Embodiment

In the present embodiment, various modifications of light emitting device 10 in FIG. 1 explained in the first embodiment will be described. In the following, description of the overlapping structure will not be repeated, and the different structure in comparison with light emitting device 10 will be mainly described.

Figure 5:
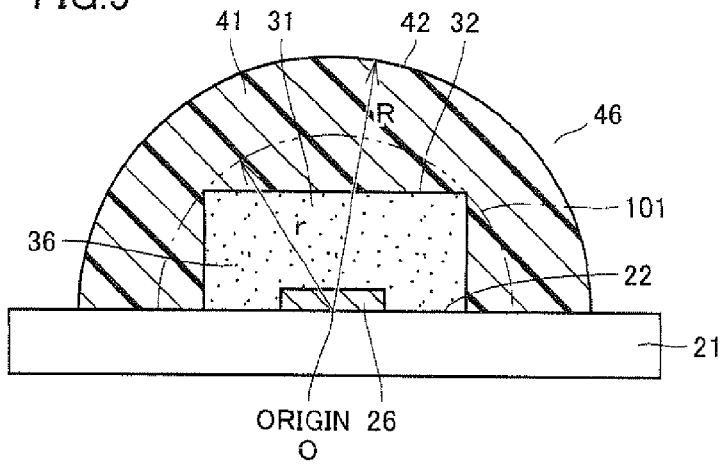
FIG. 5 is a cross-sectional view of a first modification of the light emitting device in FIG. 1.

FIG. 5 is a cross-sectional view of a first modification of the light emitting device in FIG. 1. Referring to FIG. 5, phosphor layer 31 serving as the inner portion has a rectangular parallelepiped shape in the present modification. When minimum circumference 101 including overall phosphor layer 31 has radius r, the relationship of $R > r \cdot n$ is established. As shown in the present modification, the shape of phosphor layer 31 is not limited to the spherical shape but can take any of a rectangular parallelepiped shape, a polygonal columnar shape, a columnar shape and the like.

Figure 6:
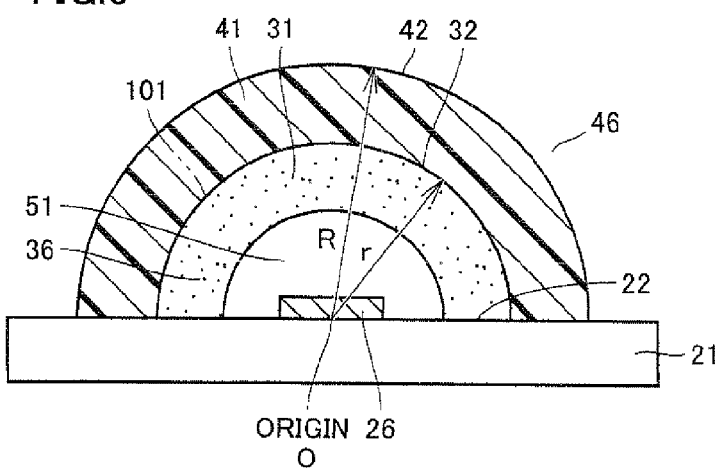
FIG. 6 is a cross-sectional view of a second modification of the light emitting device in FIG. 1.

FIG. 6 is a cross-sectional view of a second modification of the light emitting device in FIG. 1. Referring to FIG. 6, phosphor layer 31 serving as the inner portion is provided such that a hollow layer 51 is formed between LED element 26 and phosphor layer 31 on main surface 22 in the present modification. In other words, hollow layer 51, phosphor layer 31, transparent resin layer 41, and atmospheric layer 46 are arranged around LED element 26 from the inside to the outside. It is noted that a transparent resin that forms transparent resin layer 41 may be arranged instead of hollow layer 51.

Figure 7:
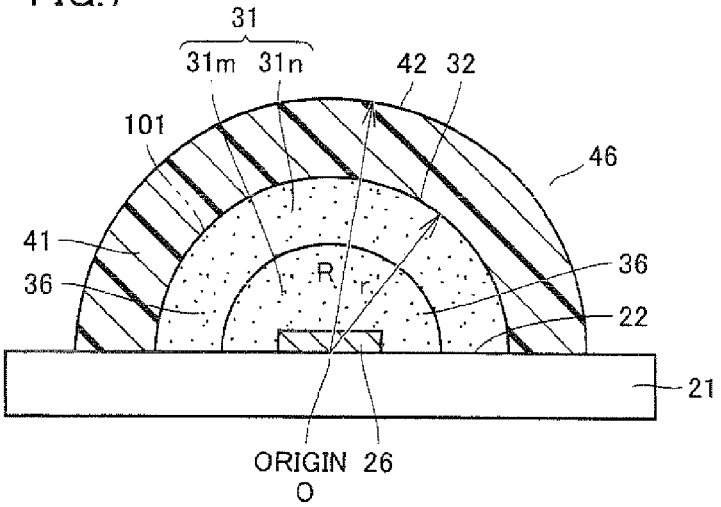
FIG. 7 is a cross-sectional view of a third modification of the light emitting device in FIG. 1.

FIG. 7 is a cross-sectional view of a third modification of the light emitting device in FIG. 1. Referring to FIG. 7, phosphor layer 31 serving as the inner portion is configured to include an inner phosphor layer 31m and an outer phosphor layer 31n in the present modification. Inner phosphor layer 31m, outer phosphor layer 31n, transparent resin layer 41, and atmospheric layer 46 are arranged around LED element 26 from the inside to the outside. Inner phosphor layer 31m is different from outer phosphor layer 31n in terms of the type of fluorescent particles 36 dispersed in each phosphor layer. As one example, fluorescent particles 36 dispersed in inner phosphor layer 31m emit red light, and fluorescent particles 36 dispersed in outer phosphor layer 31n emit green light.

Figure 8:
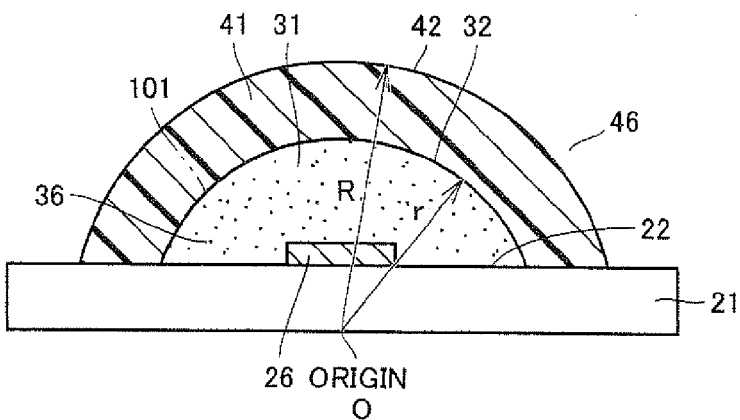
FIG. 8 is a cross-sectional view of a fourth modification of the light emitting device in FIG. 1.

FIG. 8 is a cross-sectional view of a fourth modification of the light emitting device in FIG. 1. Referring to FIG. 8, origin O that is the center of outer circumferential surface 42 and circumference 101 is arranged in a position where origin O is displaced from main surface 22 in the present modification. Origin O is displaced on the side opposite to phosphor layer 31 and transparent resin layer 41 with respect to main surface 22. In such configuration, phosphor layer 31 and transparent resin layer 41 do not have a completely hemispherical shape.

Figure 9:
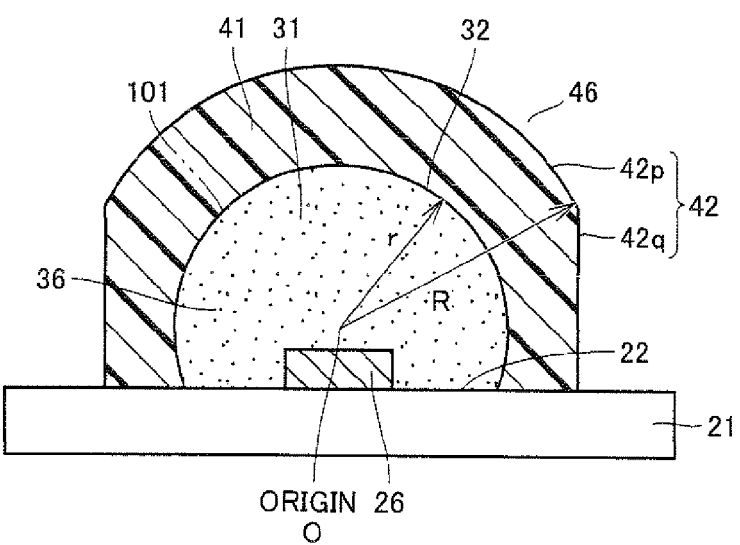
FIG. 9 is a cross-sectional view of a fifth modification of the light emitting device in FIG. 1.

FIG. 9 is a cross-sectional view of a fifth modification of the light emitting device in FIG. 1. Referring to FIG. 9, origin O that is the center of outer circumferential surface 42 and circumference 101 is arranged in a position where origin O is displaced from main surface 22 in the present modification. Origin O is displaced on the side opposite to substrate 21 with respect to main surface 22. Transparent resin layer 41 has a shape that a peripheral portion intersecting main surface 22 is missing. For example, when the size of transparent resin layer 41 must be made smaller than the thickness of the light guide plate on the assumption of an edge light type liquid crystal backlight having the light emitting device arranged on the side of the light guide plate, a part of transparent resin layer 41 projecting from the light guide plate may be cut. In other words, in a cross section shown in FIG. 9, outer circumferential surface 42 is configured to include an arc portion 42p taking the shape of an arc having radius R and a straight portion 42q extending in a straight line from arc portion 42p and intersecting main surface 22. As shown in the present modification, outer circumferential surface 42 needs not necessarily to be formed to have a shape of a completely spherical surface.

It is noted that the height of straight portion 42q is preferably lowered as much as possible in order to prevent a reduction in light extraction efficiency.

In the above-described modifications as well, by providing phosphor layer 31 and transparent resin layer 41 such that the relationship of $R > r \cdot n$ is satisfied, the light extraction efficiency into atmospheric layer 46 can be enhanced.

Figure 10:
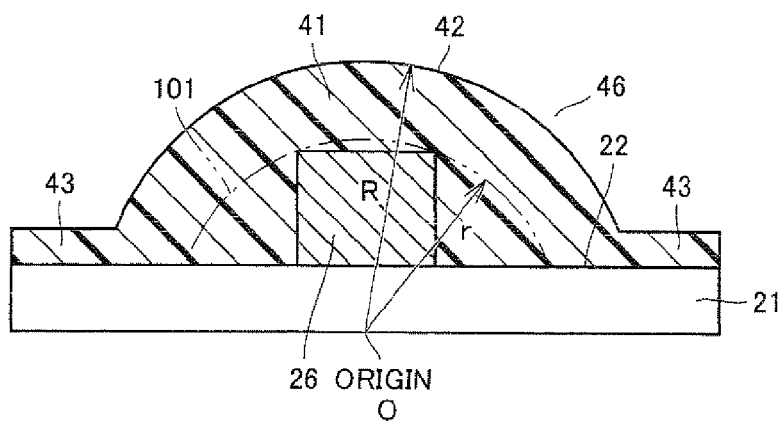
FIG. 10 is a cross-sectional view of a sixth modification of the light emitting device in FIG. 1.

FIG. 10 is a cross-sectional view of a sixth modification of the light emitting device in FIG. 1. In the present modification, phosphor layer 31 is not provided on main surface 22 and LED element 26 is directly covered with transparent resin layer 41. When minimum circumference 101 that includes overall LED element 26 has radius r, the relationship of $R > r \cdot n$ is established. In other words, the light emitting device in the present modification includes substrate 21 having main surface 22. LED element 26 provided on main surface 22 and serving as the inner portion that contains the base point of light emission, and transparent resin layer 41 having refractive index n and serving as the outer portion that covers LED element 26.

Transparent resin layer 41 is formed to include a protruding portion 43. Protruding portion 43 protrudes from outer circumferential surface 42 and extends linearly on main surface 22. Protruding portion 43 is formed by a resin injection path when transparent resin layer 41 is injection molded with a mold.

In the present modification as well, by providing LED element 26 and transparent resin layer 41 such that the relationship of $R > r \cdot n$ is satisfied, the light extraction efficiency into atmospheric layer 46 can be enhanced.

According to the light emitting device in a second embodiment of the present invention configured as described above, the effect described in the first embodiment can be obtained similarly.

Third Embodiment

In the present embodiment, a light emitting device using the structure of light emitting device 10 in FIG. 1 as well as a surface lighting device and a liquid crystal display device using this light emitting device will be described. In the following, description of the overlapping structure will not be repeated, and the different structure in comparison with light emitting device 10 will be mainly described.

Figure 11A:
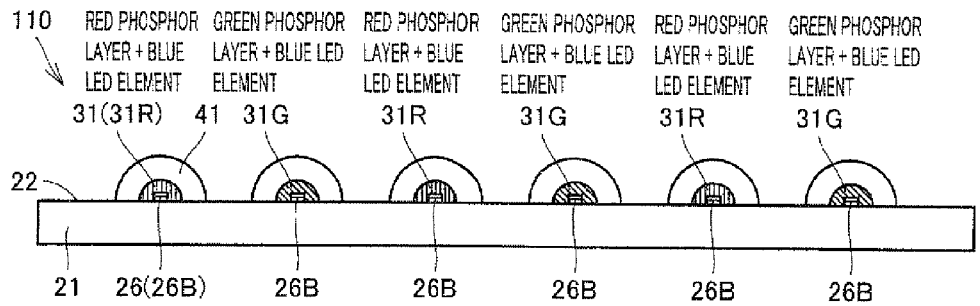
FIG. 11A is a cross-sectional view of a light emitting device in a third embodiment of the present invention.
Figure 11B:
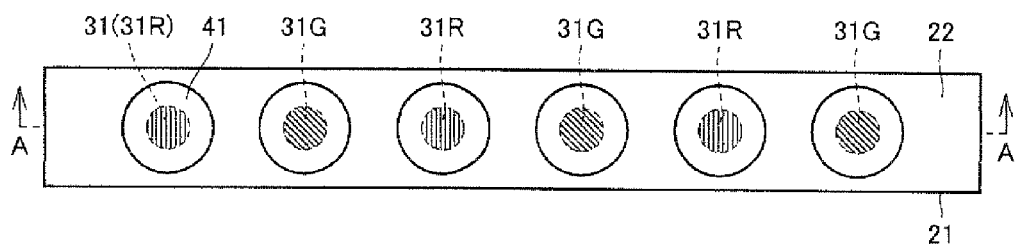
FIG. 11B is a plan view of the light emitting device in the third embodiment of the present invention.

FIGS. 11A and 11B illustrate a light emitting device in a third embodiment of the present invention. FIG. 11B is a plan view, and FIG. 11A is a cross-sectional view taken along line A-A in FIG. 11B.

Referring to FIGS. 11A and 11B, in a light emitting device 110 in the present embodiment, a plurality of LED elements 26 are arranged side by side in a straight line on main surface 22 with a spacing therebetween. Each of LED elements 26 is covered with phosphor layer 31 and transparent resin layer 41 as in light emitting device 10 in FIG. 1. With such configuration, light emitting device 110 configures a line light source.

In the present embodiment, a combination of (a blue LED element 26B that emits blue light+a red phosphor layer 31R that emits red light) and a combination of (blue LED element 26B that emits blue light+a green phosphor layer 31G that emits green light) are alternately arranged.

Figure 12:
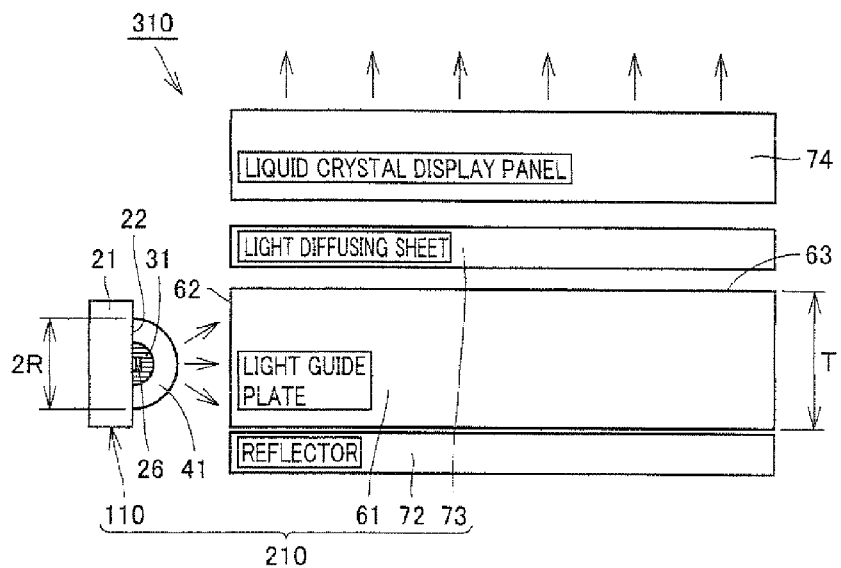
FIG. 12 is a cross-sectional view of a surface lighting device and a liquid crystal display device using the light emitting device in FIGS. 11A and 11B.

FIG. 12 is a cross-sectional view of a surface lighting device and a liquid crystal display device using the light emitting device in FIGS. 11A and 11B. Referring to FIG. 12, a surface lighting device 210 is an edge light type surface light source used as a backlight for a liquid crystal display device 310.

Surface lighting device 210 is configured to have light emitting device 110, a light guide plate 61, a reflector 72, and a light diffusing sheet 73. Light guide plate 61 has an emission surface 63 extending in the planar shape, and an incidence end surface 62 arranged on the periphery of emission surface 63 and extending in the thickness direction of light guide plate 61. Light guide plate 61 is positioned with respect to light emitting device 110 such that incidence end surface 62 faces main surface 22 of substrate 21. Light diffusing sheet 73 is arranged to overlie emission surface 63. Reflector 72 is arranged on a side of light guide plate 61 opposite to light diffusing sheet 73.

Liquid crystal display device 310 is configured to have a liquid crystal display panel 74 in addition to surface lighting device 210. Liquid crystal display panel 74 is arranged on a side of light diffusing sheet 73 opposite to light guide plate 61. In other words, light diffusing sheet 73 and liquid crystal display panel 74 are arranged in this order on emission surface 63. Assuming that the display surface side of liquid crystal display panel 74 is the front side, surface lighting device 210 is arranged on the rear surface of liquid crystal display panel 74.

Light emitted from light emitting device 110 enters light guide plate 61 through incidence end surface 62. At this time, by setting a diameter 2R of transparent resin layer 41 to be smaller than a thickness T of light guide plate 61 (R<T/2), the light emitted from light emitting device 110 can enter light guide plate 61 efficiently. The light that has entered light guide plate 61 is emitted through emission surface 63 toward liquid crystal display panel 74 while being reflected by reflector 72.

Description of various modifications of the light emitting device in FIGS. 11A and 11B as well as a surface lighting device and a liquid crystal display device using the light emitting device will follow.

Figure 13A:
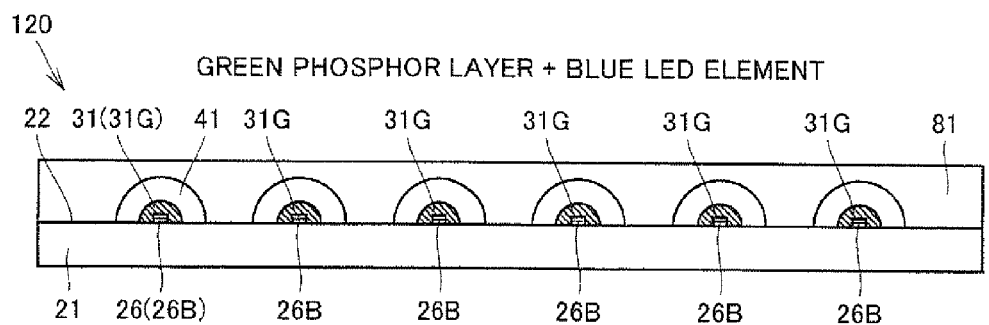
FIG. 13A is a cross-sectional view of a first modification of the light emitting device in FIGS. 11A and 11B.
Figure 13B:
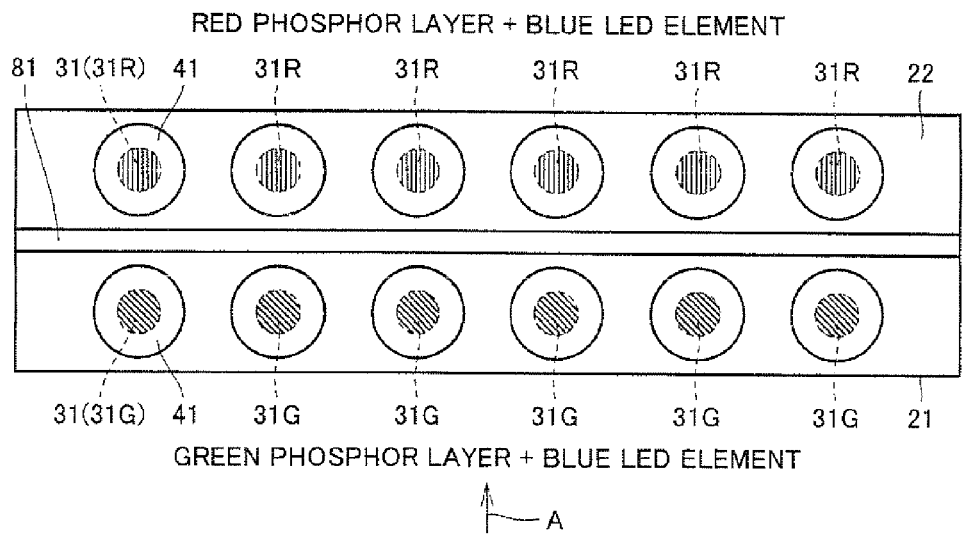
FIG. 13B is a plan view of the first modification of the light emitting device in FIGS. 11A and 11B.

FIGS. 13A and 13B illustrate a first modification of the light emitting device in FIGS. 11A and 11B. FIG. 13B is a plan view, and FIG. 13A is a side view seen from the direction shown by an arrow A in FIG. 13B.

Referring to FIGS. 13A and 13B, in a light emitting device 120 in the present modification, the plurality of LED elements 26 are arranged side by side in a straight line on main surface 22 with a spacing therebetween. A partition wall 81 is placed on main surface 22, and the plurality of LED elements 26 arranged side by side in a straight line are provided on both sides of partition wall 81, respectively. Each of LED elements 26 is covered with phosphor layer 31 and transparent resin layer 41 as in light emitting device 10 in FIG. 1.

In the present modification, the combination of (blue LED element 26B that emits blue light+green phosphor layer 31G that emits green light) is arranged on one side of partition wall 81, and the combination of (blue LED element 26B that emits blue light+red phosphor layer 31R that emits red light) is arranged on the other side of partition wall 81.

Figure 14:
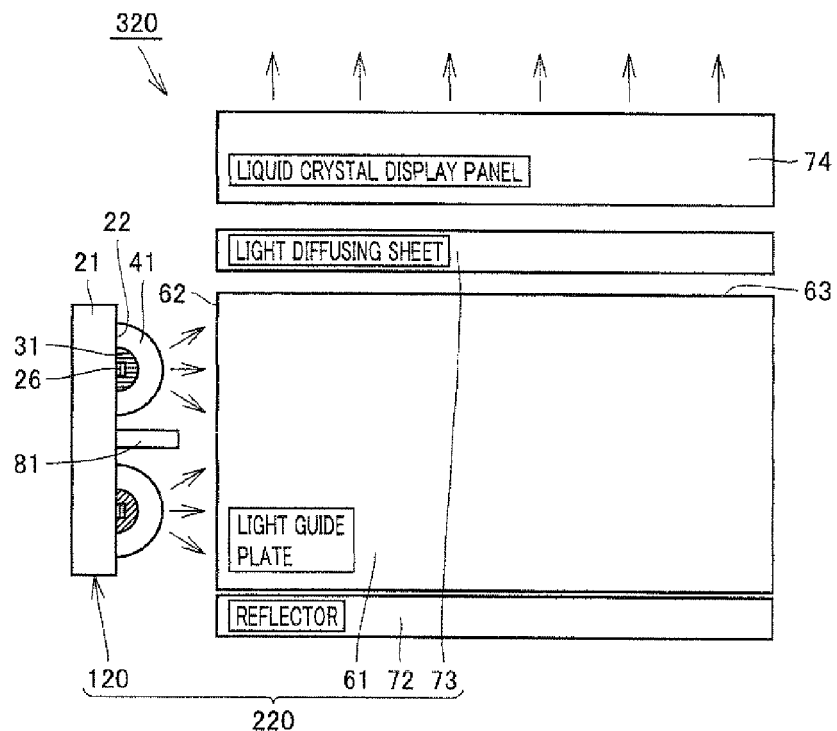
FIG. 14 is a cross-sectional view of a surface lighting device and a liquid crystal display device using the light emitting device in FIGS. 13A and 13B.

FIG. 14 is a cross-sectional view of a surface lighting device and a liquid crystal display device using the light emitting device in FIGS. 13A and 13B. Referring to FIG. 14, a surface lighting device 220 and a liquid crystal display device 320 using light emitting device 120 in. FIGS. 13A and 13B have a structure similar to that of surface lighting device 210 and liquid crystal display device 310 in FIG. 12. In surface lighting device 220 and liquid crystal display device 320, absorption of green light emitted from one side of partition wall 81 by the light emitting device formed of the combination of (blue LED element 26B that emits blue light+red phosphor layer 31R that emits red light) arranged on the other side of partition wall 81 can be suppressed.

Figure 15A:
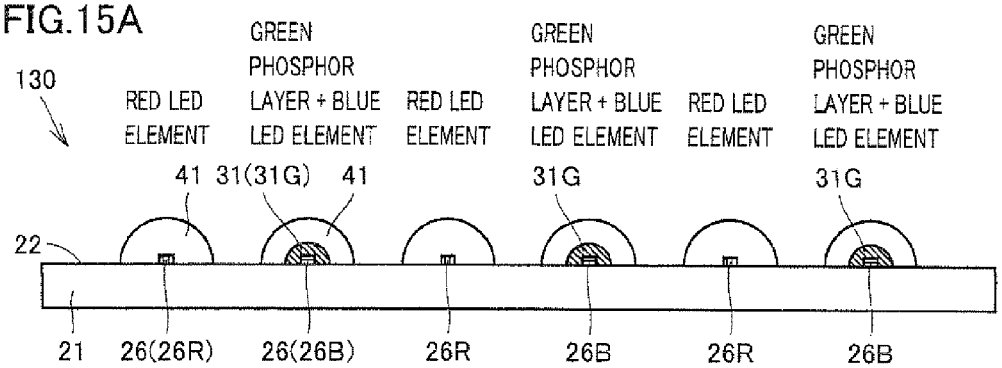
FIG. 15A is a cross-sectional view of a second modification of the light emitting device in FIGS. 11A and 11B.
Figure 15B:
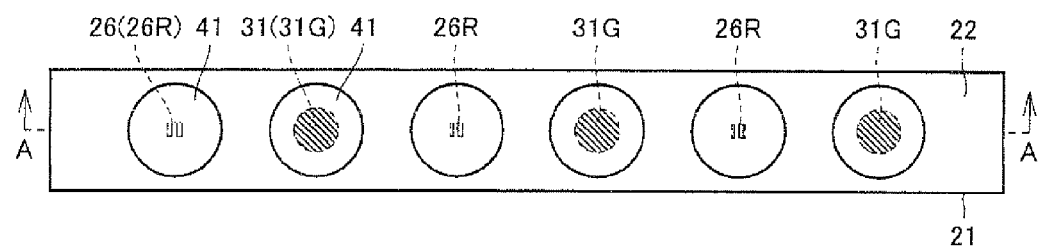
FIG. 15B is a plan view of the second modification of the light emitting device in FIGS. 11A and 11B.

FIGS. 15A and 15B illustrate a second modification of the light emitting device in FIGS. 11A and 11B. FIG. 15B is a plan view, and FIG. 15A is a cross-sectional view taken along line A-A in FIG. 15B.

Referring to FIGS. 15A and 15B, in a light emitting device 130 in the present modification, the plurality of LED elements 26 are arranged side by side in a straight line on main surface 22 with a spacing therebetween. In the present modification, a red LED element 26R that emits red light and is directly covered with transparent resin layer 41, as well as blue LED element 26B that emits blue light and is covered with green phosphor layer 31G that emits green light and transparent resin layer 41 as in light emitting device 10 in FIG. 1 are alternately arranged.

It is noted that the combination of (blue LED element 26B that emits blue light+red phosphor layer 31R that emits red light) shown in FIGS. 13A and 13B may be replaced with red LED element 26R directly covered with transparent resin layer 41.

A surface lighting device and a liquid crystal display device using light emitting device 130 in the present modification are configured to have a structure similar to that of surface lighting device 210 and liquid crystal display device 310 in FIG. 12.

According to the light emitting device, the surface lighting device and the liquid crystal display device in the third embodiment of the present invention configured as described above, the effect described in the first embodiment can be obtained similarly. In addition, the use of the light emitting device having excellent light extraction efficiency allows achievement of a high-luminance surface lighting device, and further, enhancement of the brightness of display in liquid crystal display panel 74.

Although the case where phosphor layer 31 and transparent resin layer 41 are provided as in light emitting device 10 in FIG. 1 has been described in the present embodiment, phosphor layer 31 and transparent resin layer 41 may be provided as in various modifications in the second embodiment.

Fourth Embodiment

In the present embodiment, a light emitting device using the structure of the light emitting device in FIG. 10, as well as a surface lighting device and a liquid crystal display device using this light emitting device will be described. In the following, description of the overlapping structure will not be repeated, and the different structure in comparison with the light emitting device in FIG. 10 will be mainly described.

Figure 16:
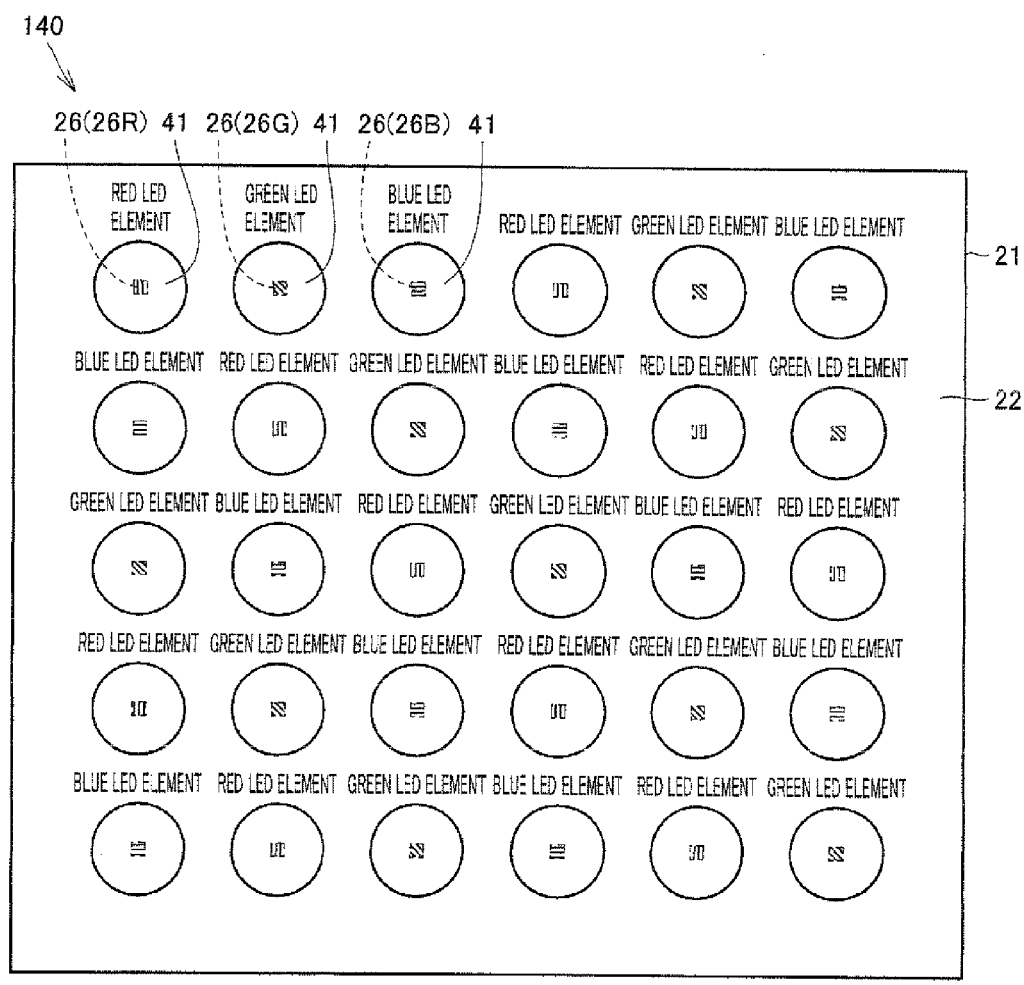
FIG. 16 is a plan view of a light emitting device in a fourth embodiment of the present invention.
Figure 17:
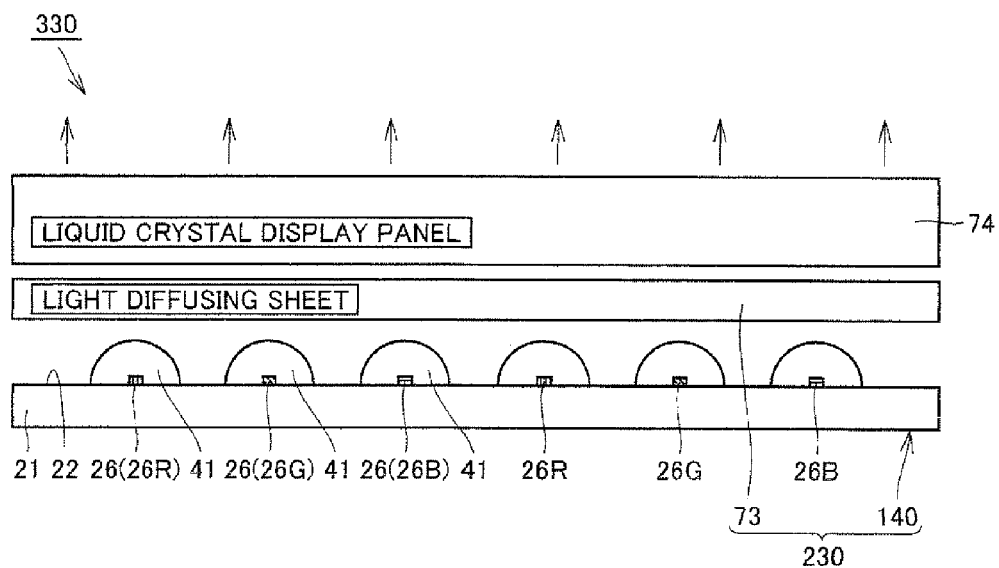
FIG. 17 is a cross-sectional view of a surface lighting device and a liquid crystal display device using the light emitting device in FIG. 16.

FIG. 16 is a plan view of a light emitting device in a fourth embodiment of the present invention. FIG. 17 is a cross-sectional view of a surface lighting device and a liquid crystal display device using the light emitting device in FIG. 16.

Referring to FIG. 16, in a light emitting device 140 in the present embodiment, the plurality of LED elements 26 are arranged side by side in the planar shape with a spacing therebetween. Each of the plurality of LED elements 26 is covered with transparent resin layer 41 as in the light emitting device in FIG. 10. In the present embodiment, red LED element 26R that emits red light, a green LED element 26G that emits green light, and blue LED element 26B that emits blue light are arranged side by side in this order. With such configuration, light emitting device 140 configures a surface light source.

Referring to FIG. 17, a surface lighting device 230 in the present embodiment is a directly below type surface light source used as a backlight for a liquid crystal display device 330. Surface lighting device 230 is configured to have light emitting device 140 and light diffusing sheet 73. Light diffusing sheet 73 is positioned with respect to light emitting device 140 to face main surface 22 of substrate 21.

Liquid crystal display device 330 is configured to have liquid crystal display panel 74 in addition to surface lighting device 230. Liquid crystal display panel 74 is arranged on a side of light diffusing sheet 73 opposite to light emitting device 140.

According to the light emitting device, the surface lighting device and the liquid crystal display device in the fourth embodiment of the present invention configured as described above, the effect described in the third embodiment can be obtained similarly.

Fifth Embodiment

In the present embodiment, another form of light emitting device 10 in FIG. 1 will be described. In the following, description of the overlapping structure will not be repeated.

Figure 18:
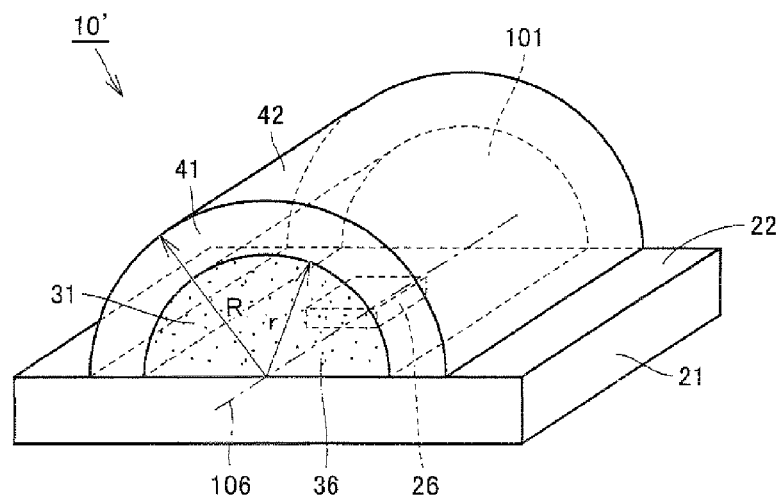
FIG. 18 is a perspective view of a light emitting device in a fifth embodiment of the present invention.

FIG. 18 is a perspective view of a light emitting device in a fifth embodiment of the present invention. Referring to FIG. 18, in a light emitting device 10' in the present embodiment, phosphor layer 31 and transparent resin layer 41 have a shape of a semicircular column obtained by extending the semicircular cross section in the axial direction of a central axis 106. When light emitting device 10' is cut at a plane orthogonal to central axis 106, a cut surface having a shape similar to the shape shown in FIG. 1 is obtained. In this cut surface, phosphor layer 31 and transparent resin layer 41 are provided such that the relationship of R>r·n is established. As described above, the shape of phosphor layer 31 and transparent resin layer 41 is not limited to the spherical shape but can take any shape including the cross-sectional shape shown in FIG. 1.

Figure 19A:
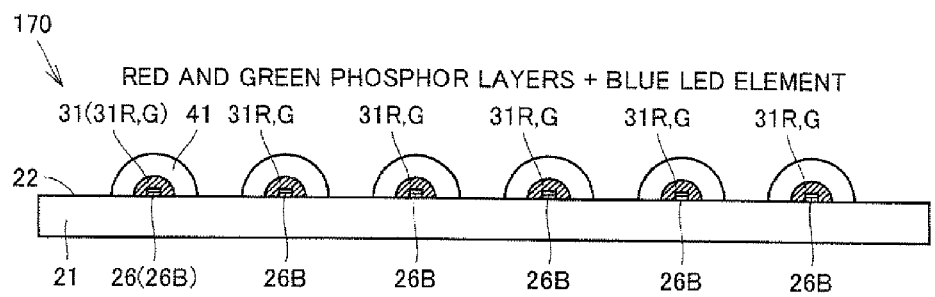
FIG. 19A is a cross-sectional view of a light emitting device using the structure of the light emitting device in FIG. 18.
Figure 19B:
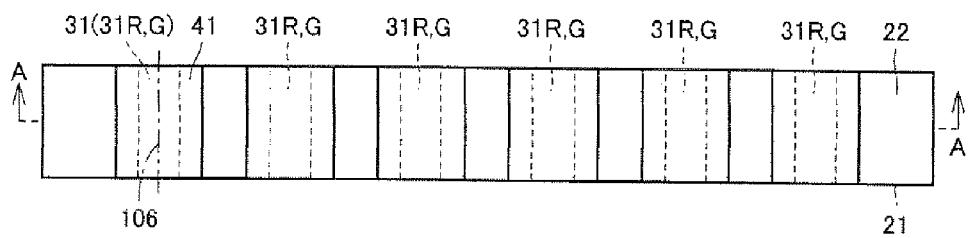
FIG. 19B is a plan view of the light emitting device using the structure of the light emitting device in FIG. 18.

FIGS. 19A and 19B illustrate a light emitting device using the structure of the light emitting device in FIG. 18. FIG. 19B is a plan view, and FIG. 19A is a cross-sectional view taken along line A-A in FIG. 19B.

Referring to FIGS. 19A and 19B, in a light emitting device 170, the plurality of blue LED elements 26B that emit blue light are arranged side by side in a straight line on main surface 22 with a spacing therebetween. Each of blue LED elements 26B is covered with red and green phosphor layers 31R and 31G that emit red and green lights, and transparent resin layer 41. The axial direction of central axis 106 is orthogonal to the direction in which the plurality of LED elements 26 are arranged.

Although the example in which the plurality of LED elements 26 are mounted on single substrate 21 has been described in the present embodiment, the present invention is not limited thereto. As will be explained in a tenth embodiment that will be described later, LED elements 26 may be structured such that each LED element 26 is installed on each substrate 21 to configure an individual light emitting device, and this light emitting device is installed on a housing substrate, a mounting substrate or the like.

Figure 20A:
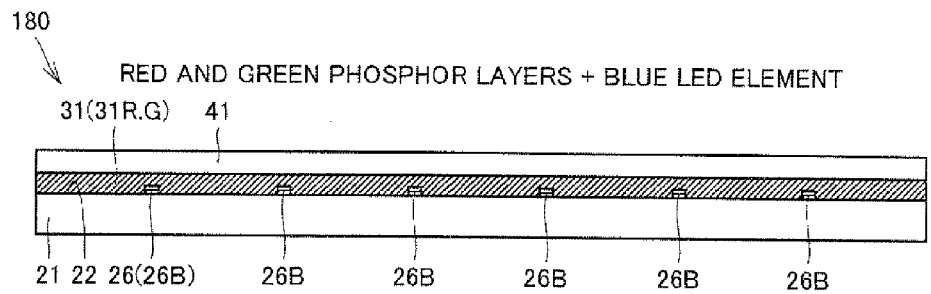
FIG. 20A is a cross-sectional view of a modification of the light emitting device in FIGS. 19A and 19B.
Figure 20B:
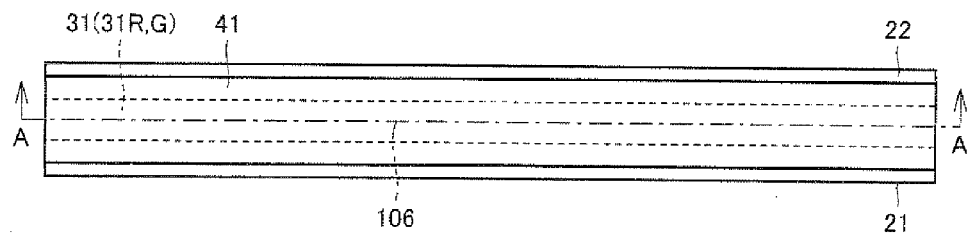
FIG. 20B is a plan view of the modification of the light emitting device in FIGS. 19A and 19B.

FIGS. 20A and 20B illustrate a modification of the light emitting device in FIGS. 19A and 19B. FIG. 20B is a plan view, and FIG. 20A is a cross-sectional view taken along line A-A in FIG. 20B.

Referring to FIGS. 20A and 20B, in a light emitting device 180 in the present modification, the plurality of blue LED elements 26B that emit blue light are arranged side by side in a straight line on main surface 22 with a spacing therebetween. The plurality of blue LED elements 26B are covered with common red and green phosphor layers 31R and 31G and transparent resin layer 41. The cross-sectional shape of light emitting device 180 in the direction perpendicular to the direction in which the plurality of blue LED elements 26B are arranged is the same as the cross-sectional shape shown in the third modification (FIG. 7) in the second embodiment. The dimensional relationship of red and green phosphor layers 31R and 31G and transparent resin layer 41 is also the same as the relationship in the third modification (FIG. 7) in the second embodiment. In the present modification, the axial direction of central axis 106 matches the direction in which the plurality of LED elements 26 are arranged.

A surface lighting device and a liquid crystal display device using light emitting device 180 in the present modification are configured to have a structure similar to that of surface lighting device 210 and liquid crystal display device 310 in FIG. 12.

According to the light emitting device in the fifth embodiment of the present invention configured as described above, the effect described in the first embodiment can be obtained similarly.

Sixth Embodiment

In the present embodiment, a light emitting device using the structure of light emitting device 10 in FIG. 1 will be described. In the following, description of the overlapping structure will not be repeated, and the different structure in comparison with light emitting device 10 in FIG. 1 will be mainly described.

Figure 21A:
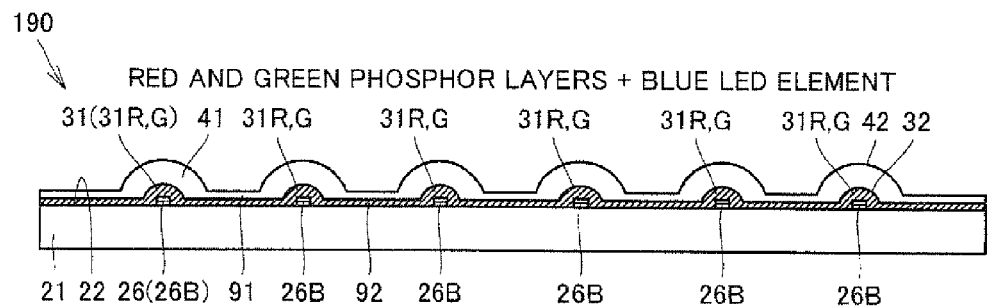
FIG. 21A is a cross-sectional view of a light emitting device in a sixth embodiment of the present invention.
Figure 21B:
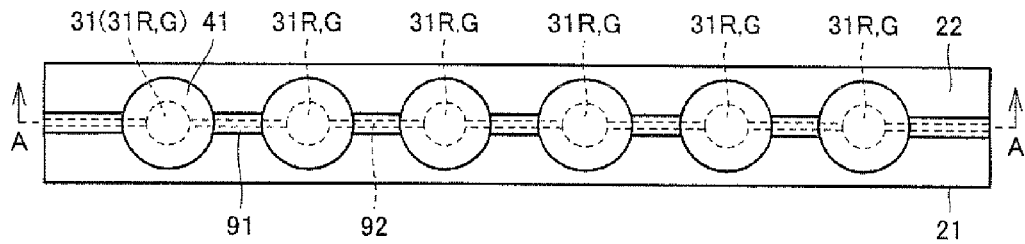
FIG. 21B is a plan view of the light emitting device in the sixth embodiment of the present invention.

FIGS. 21A and 21B illustrate a light emitting device in a sixth embodiment of the present invention. FIG. 21B is a plan view, and FIG. 21A is a cross-sectional view taken along line A-A in FIG. 21B.

Referring to FIGS. 21A and 21B, in a light emitting device 190 in the present embodiment, the plurality of blue LED elements 26B that emit blue light are arranged side by side in a straight line on main surface 22 with a spacing therebetween. Each of blue LED elements 26B is covered with red and green phosphor layers 31R and 31G that emit red and green lights, and transparent resin layer 41.

Transparent resin layer 41 and phosphor layer 31 are formed to include a protruding portion 91 and a protruding portion 92, respectively. Protruding portion 92 protrudes from outer circumferential surface 32 and extends linearly on main surface 22. Protruding portion 91 protrudes from outer circumferential surface 42 and extends linearly to cover protruding portion 92 on main surface 22. Protruding portion 91 extends between adjacent transparent resin layers 41, and protruding portion 92 extends between adjacent phosphor layers 31. Protruding portion 91 and protruding portion 92 are formed by a resin injection path when transparent resin layer 41 and phosphor layer 31 are injection molded with a mold.

Figure 22A:
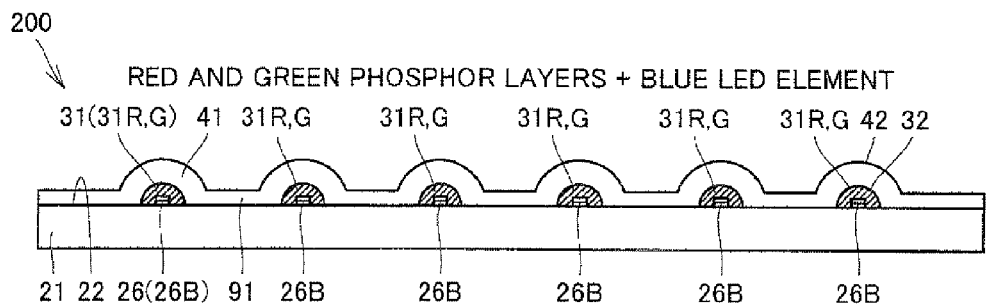
FIG. 22A is a cross-sectional view of a modification of the light emitting device in FIGS. 21A and 21B.
Figure 22B:
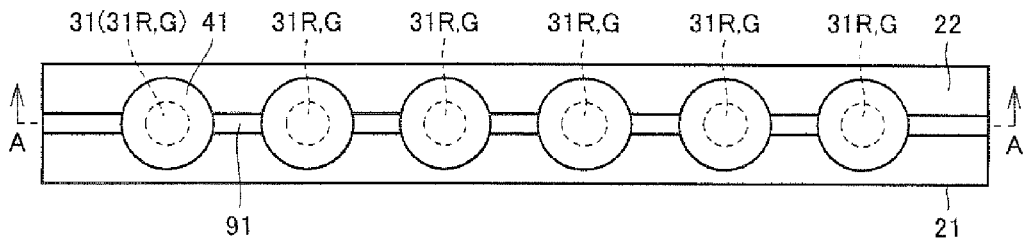
FIG. 22B is a plan view of the modification of the light emitting device in FIGS. 21A and 21B.

FIGS. 22A and 22B illustrate a modification of the light emitting device in FIGS. 21A and 21B. FIG. 22B is a plan view, and FIG. 22A is a cross-sectional view taken along line A-A in FIG. 22B.

Referring to FIGS. 22A and 22B, in a light emitting device 200 in the present modification, transparent resin layer 41 is formed to include protruding portion 91. On the other hand, a plurality of phosphor layers 31 are provided on main surface 22 independently of one another. Phosphor layer 31 can take a free shape as long as phosphor layer 31 falls within circumference 101 in FIG. 1. Therefore, in phosphor layer 31, request for accuracy of the shape is not strong as compared with transparent resin layer 41. Thus, phosphor layer 31 may be formed by using a method such as application with a dispenser, if the orientation properties, the luminance and the chromaticity of the plurality of LED elements 26 are within prescribed variations.

According to the light emitting device in the sixth embodiment of the present invention configured as described above, the effect described in the first embodiment can be obtained similarly.

A new light emitting device, a surface lighting device and a liquid crystal display device may be configured by appropriately combining the light emitting device, the surface lighting device and the liquid crystal display device described in the above first to sixth embodiments.

Seventh Embodiment

Figure 23A:
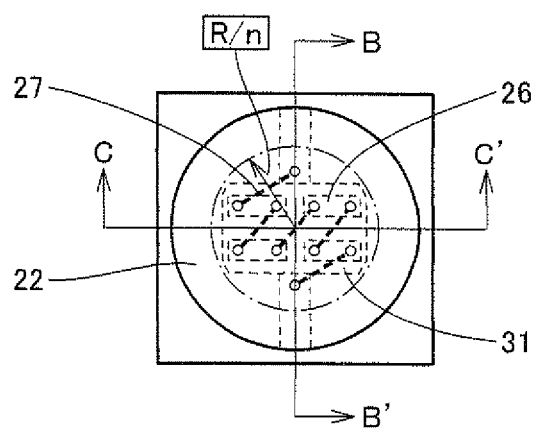
FIG. 23A is a plan view of a light emitting device in a seventh embodiment of the present invention.
Figure 23B:
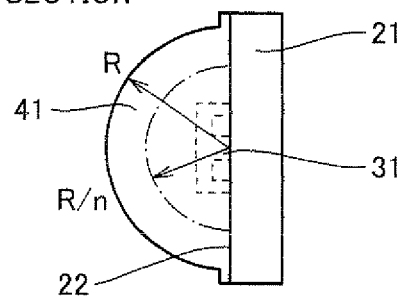
FIG. 23B is a cross-sectional view of the light emitting device in the seventh embodiment of the present invention.
Figure 23C:
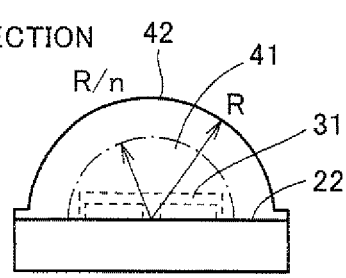
FIG. 23C is another cross-sectional view of the light emitting device in the seventh embodiment of the present invention.

FIGS. 23A, 23B and 23C illustrate a light emitting device in a seventh embodiment of the present invention. FIG. 23A is a plan view, FIG. 23B is a cross-sectional view taken along line B-B' in FIG. 23A, and FIG. 23C is a cross-sectional view taken along line C-C in FIG. 23A.

Referring to FIGS. 23A, 23B and 23C, a light emitting device 510 in the present embodiment includes substrate 21, four LED elements 26 die-bonded to a central portion of main surface 22 of substrate 21, phosphor layer 31 that covers these LED elements 26, and transparent resin layer 41 that covers phosphor layer 31 in the shape of a hemispherical dome. Transparent resin layer 41 has a refractive index of n=1.41. Transparent resin layer 41 covers main surface 22 with a circle having radius R (1.4 mm). On the other hand, phosphor layer 31 is formed within a hemisphere (shown by an imaginary alternate long and short dash line in the figure) having a radius R/n that is concentric with the circle having radius R.

As described above, light emitting device 510 is characterized in that only the vicinity of LED element 26 is covered with phosphor layer 31 and a portion located far from LED element 26 is not covered with phosphor layer 31 on main surface 22.

Phosphor layer 31 is excited by primary light emitted by LED element 26 and emits secondary light. In contrast, the main ingredient of the emitted secondary light is the ingredient of phosphor layer 31 in the vicinity of LED element 26, and the ingredient of the portion located far from LED element 26 is small. When phosphor layer 31 covers main surface 22 in the portion located far from LED element 26, phosphor layer 31 inhibits reflection at main surface 22 and has the function of absorbing a part of emitted light, which leads to a reduction in light extraction efficiency. Therefore, phosphor layer 31 is preferably configured such that phosphor layer 31 covers only the vicinity of LED element 26 and does not cover the portion located far from LED element 26 on main surface 22. As a result, reflection at main surface 22 can be effectively used and the light extraction efficiency can be enhanced.

Figure 24A:
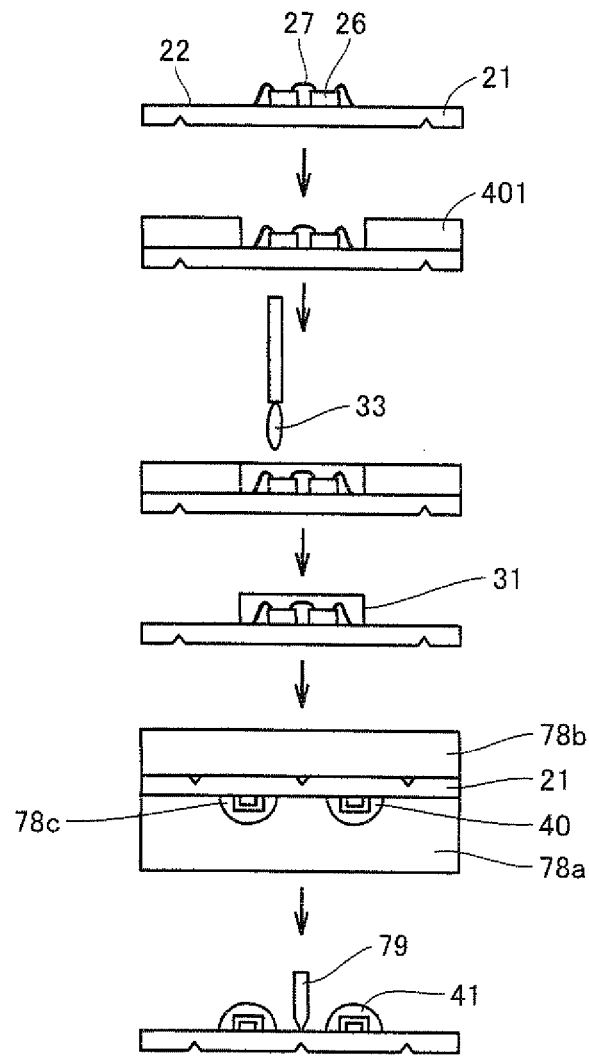
FIG. 24A is a cross-sectional view illustrating steps of a method for manufacturing the light emitting device in the seventh embodiment of the present invention.
Figure 24B:
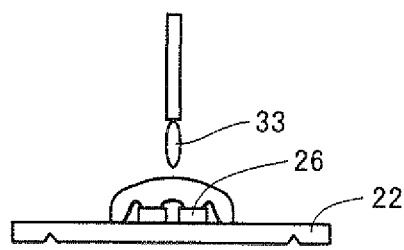
FIG. 24B is a cross-sectional view illustrating steps of a modification of the method for manufacturing the light emitting device in the seventh embodiment of the present invention.

A method for manufacturing a light emitting device will be described hereinafter. FIG. 24A is a cross-sectional view illustrating steps of a method for manufacturing the light emitting device in the seventh embodiment of the present invention. FIG. 24B is a cross-sectional view illustrating steps of a modification of the method for manufacturing the light emitting device in the seventh embodiment of the present invention.

It is noted that components shown in the figures are described in a simplified manner as needed without making the components ambiguous.

Referring to FIG. 24A, first, LED element 26 is die-bonded in a prescribed position on main surface 22 of substrate 21. Next, an electrode of LED element 26 and an electrode of substrate 21 (not shown) are wire-bonded by a wire 27 to electrically connect the electrode of LED element 26 and the electrode of substrate 21. An electrode for wire-bonding is provided on main surface 22, and an electrode for connecting to an external circuit is provided on the back surface of substrate 21. Both electrodes are electrically continuous by a through hole (not shown). With such configuration, the light emitting device is configured to be capable of supplying electric power to LED element 26. The material of substrate 21 preferably has high reflection at main surface 22 as described above. A ceramic substrate is suitably used as substrate 21.

Next, LED element 26 is covered with phosphor layer 31. First, a dam sheet 401 serving as a blocking component is affixed to a surface of main surface 22 where LED element 26 is die-bonded. A through hole that can house LED element 26 is formed in dam sheet 401. Dam sheet 401 is a component affixed to substrate 21 such that LED element 26 is placed in the through hole, and is a component for blocking the outflow and spread of a resin 33 including fluorescent particles that will be described later to main surface 22, when resin 33 is injected into the through hole. Next, resin 33 including the fluorescent particles is injected to fill the through hole. At this time, due to the surface tension occurring between resin 33 and dam sheet 401, the outflow of resin 33 outside of the through hole is suppressed and a meniscus may be generated. Even in this case, the relationship of R>r·n is preferably satisfied.

Resin 33 including the fluorescent particles is obtained by dispersing fluorescent particles 36 in a transparent resin such as a silicone resin. A sheet obtained by applying an adhesive to one surface of a sheet made of a resin such as Teflon® and fluorine-containing rubber can be used as dam sheet 401, for example. The fluorine-containing rubber is preferable as a material used for dam sheet 401 because the fluorine-containing rubber has high elasticity and facilitates removal of dam sheet 401. The adhesive which facilitates affixation to main surface 22 and whose residue is not left on main surface 22 when dam sheet 401 is removed is preferable.

Next, resin 33 including the fluorescent particles is cured under the conditions of 150° C. and 120 minutes, and then, dam sheet 401 is removed. As a result, phosphor layer 31 is formed. A method for removing dam sheet 401 includes a method for grasping one end of dam sheet 401 with a jig and tearing dam sheet 401. At this time, resin 33 including the fluorescent particles that has overflowed from the through hole can be removed together with dam sheet 401.

Next, phosphor layer 31 is covered with the transparent resin in the shape of a hemispherical dome. Compression molding, for example, can be used as a method for covering phosphor layer 31 with the transparent resin. In the case of compression molding, a female die 78a including a cavity 78c in the shape of a hemispherical dome is used to cover phosphor layer 31 with transparent resin layer 41 having the shape of a hemispherical dome.

First, a transparent resin 40 is injected into cavity 78c to fill cavity 78c. Next, substrate 21 is set on female die 78a, clamping is performed with a base die 78b, and substrate 21 is under the conditions of a temperature of 150° C. for approximately one minute to cure transparent resin 40. At this time, the state where phosphor layer 31 is placed in cavity 78c is obtained. Next, substrate 21 is removed from female die 78a. When transparent resin layer 41 in the shape of a hemispherical dome is formed by compression molding, transparent resin 40 connects adjacent cavities, so that thin transparent resin layer 41 may extend at a peripheral portion of the hemispherical dome and cover main surface 22.

Next, after cure is performed under the conditions of 150° C. and two hours, and then, substrate 21 is split into individual light emitting devices. At this time, a method for shearing, with a cutter 79, an upper portion of a split groove provided in the back surface of substrate 21 from the side where transparent resin layer 41 is formed can be used. According to such method, transparent resin layer 41 is sheared with cutter 79 and substrate 21 is divided along the split groove, so that substrate 21 can be readily split into individual light emitting devices.

Description of an example carried out to evaluate light emitting device 510 in the present embodiment will follow.

By using the above manufacturing method, light emitting device 510 including transparent resin layer 41 in the shape of a hemispherical dome having a radius of R=1.4 mm was formed on substrate 21 having a 3.2 mm square size, as shown in FIGS. 23A, 23B and 23C. Four LED elements 26 are die-bonded to the central portion of main surface 22. Four LED elements 26 are serially connected by wire-bonding, and further, are covered with phosphor layer 31. The center of the hemispherical dome is arranged at the center of arrangement of LED elements 26 and at a height of 100 µm with respect to main surface 22. The bottom surface of the hemispherical dome has a diameter of 2.8 mm and the height from main surface 22 to the top of the hemispherical dome is 1.5 mm. Transparent resin layer 41 having a thickness of approximately 50 µm extends on the periphery of the hemispherical dome, and transparent resin layer 41 covers overall main surface 22.

LED element 26 has a dimension of 240 µm×600 µm and a thickness of 100 µm. In a region at the central portion of main surface 22, four LED elements 26 are positioned at substantially equal spacings in two lines by two rows when main surface 22 is viewed two-dimensionally.

Phosphor layer 31 has a dimension of 0.9 mm×1.6 mm and a thickness of 0.38 mm. The area of main surface 22 covered with phosphor layer 31 is almost 1.4 mm². On the other hand, the bottom surface of the hemispherical dome has a diameter of 2.8 mm, and thus, the area of the bottom surface is 6.2 mm². Accordingly, a ratio of the area of main surface 22 covered with phosphor layer 31 to the area of the bottom surface of the hemispherical dome is approximately 23%. Chamfering four corners of phosphor layer 31 allows further reduction in the covered area.

According to the above description, light emitting device 510 is intended to effectively use reflection at main surface 22. Therefore, the ratio of the area of main surface 22 covered with phosphor layer 31 to the area of the bottom surface of the hemispherical dome should not be limited to a particular value.

According to the graph in FIG. 4 described in the first embodiment, using, as a reference, a value when radius r of phosphor layer 31 is equal to radius R of transparent resin layer 41, that is, when the ratio of the area of main surface 22 covered with phosphor layer 31 to the area of the bottom surface of the hemispherical dome is 100%, the light extraction efficiency increases with the increase in radius R of outer circumferential surface 42 of the hemispherical dome, and is almost saturated on the condition of R>r·n. Accordingly, it is considered that the effect of enhancing the light extraction efficiency is achieved even when the ratio of the area of main surface 22 covered with phosphor layer 31 to the area of the bottom surface of the hemispherical dome is less than 100%, for example 95%, and preferably 80% or less, and the light extraction efficiency tends to be saturated near $(1/n)^2$.

Next, a comparison was made in terms of total luminous flux between the light emitting device obtained by forming phosphor layer 31 by compression molding and light emitting device 510 in the present embodiment. In the case of the light emitting device obtained by forming phosphor layer 31 by compression molding, the phosphor layer extending from the position where LED element 26 is die-bonded covers a part or all of the main surface with a thickness of approximately 100 to 200 µm, due to the manufacturing method. The remaining configuration, however, is equal to that of light emitting device 510.

Consequently, in light emitting device 510 in the present embodiment, an increase in total luminous flux at a ratio of 10 to 20% was recognized, as compared with the light emitting device obtained by forming phosphor layer 31 by compression molding.

As described above, according to the light emitting device configured such that only the vicinity of LED element 26 is covered with phosphor layer 31 and the portion located far from LED element 26 is not covered with phosphor layer 31 on main surface 22, the light extraction efficiency can be enhanced by effectively using reflection at main surface 22. In addition, since the dimension of phosphor layer 31 is determined by the dimension of the through hole, the dimensional accuracy is high, which is advantageous to suppression of variations in luminance and chromaticity.

Figure 25A:
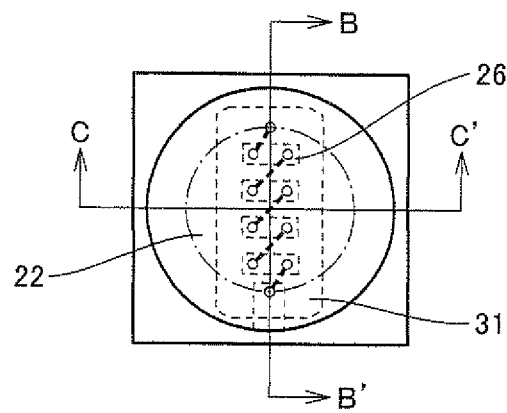
FIG. 25A is a plan view of a modification of the light emitting device in FIGS. 23A, 23B and 23C.
Figure 25B:
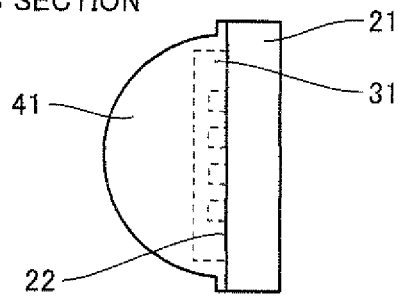
FIG. 25B is a cross-sectional view of the modification of the light emitting device in FIGS. 23A, 23B and 23C.
Figure 25C:
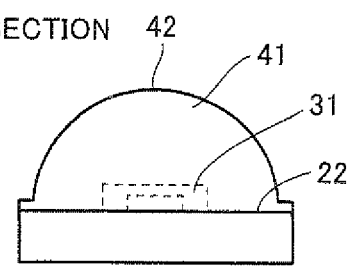
FIG. 25C is another cross-sectional view of the modification of the light emitting device in FIGS. 23A, 23B and 23C.

Description of a modification of light emitting device 510 will follow. FIGS. 25A, 25B and 25C illustrate a modification of the light emitting device in FIGS. 23A, 23B and 23C. FIG. 25A is a plan view, FIG. 25B is a cross-sectional view taken along line B-B' in FIG. 25A, and FIG. 25C is a cross-sectional view taken along line C-C' in FIG. 25A.

Referring to FIGS. 25A, 25B and 25C, in a light emitting device 520 in the present modification, four LED elements 26 are arranged at the central portion of main surface 22. Four LED elements 26 are die-bonded at substantially equal spacings in a line such that the longitudinal directions of respective LED elements face one another. The configuration of light emitting device 520 is otherwise equal to that of light emitting device 510. With such configuration, LED element 26 and wire 27 are arranged in one direction, and thus, die-bonding and wire-bonding are easy.

At an end of phosphor layer 31 in the longitudinal direction thereof, phosphor layer 31 projects from the hemisphere (shown by an imaginary alternate long and short dash line in the figure) having radius Rill that is concentric with the circle having radius R. LED element 26, however, is die-bonded in a position within radius R/n that satisfies the condition of R>r·n, and phosphor layer 31 that contributes to emission of light is mainly a portion arranged in the vicinity of LED element 26. Therefore, it is considered that a position r of a light emission point from the center of the hemispherical dome can be regarded as substantially satisfying the condition of R>r·n and the effect of enhancing the light extraction efficiency is obtained. Accordingly, it is considered that even when position r of a part of phosphor layer 31 from the center of the hemispherical dome does not satisfy the condition of R>r·n, and further, even when phosphor layer 31 projects from the hemispherical dome, the function of enhancing the light extraction efficiency is obtained if at least some of LED elements 26 are die-bonded in position r that satisfies the condition of R>r·n.

It is noted that a modification of a method for forming phosphor layer 31 includes a method for potting resin 33 including the fluorescent particles onto LED element 26 die-bonded to main surface 22 to cover LED element 26 and curing resin 33 including the fluorescent particles while maintaining the shape of phosphor layer 31 due to thixotropy. According to this method, although some of phosphor layer 31 spread out over main surface 22, dam sheet 401 is not required, which simplifies the manufacturing steps.

According to this method, potting can be performed for several times. In other words, potting and temporary curing are repeated and coverings are stacked to form phosphor layer 31. According to this method, increasing and decreasing the dimension of phosphor layer 31 are easy.

Eighth Embodiment

A light emitting device in the present embodiment is characterized in that a dam sheet has both the function of blocking a resin including fluorescent particles and the reflection function of the dam sheet itself, the dam sheet having a high reflectivity is used, and a dome is formed on the dam sheet with the dam sheet affixed to a substrate. The light emitting device in the present embodiment is otherwise equal to the light emitting device described in the seventh embodiment, and thus, the different point will be described.

Figure 26:
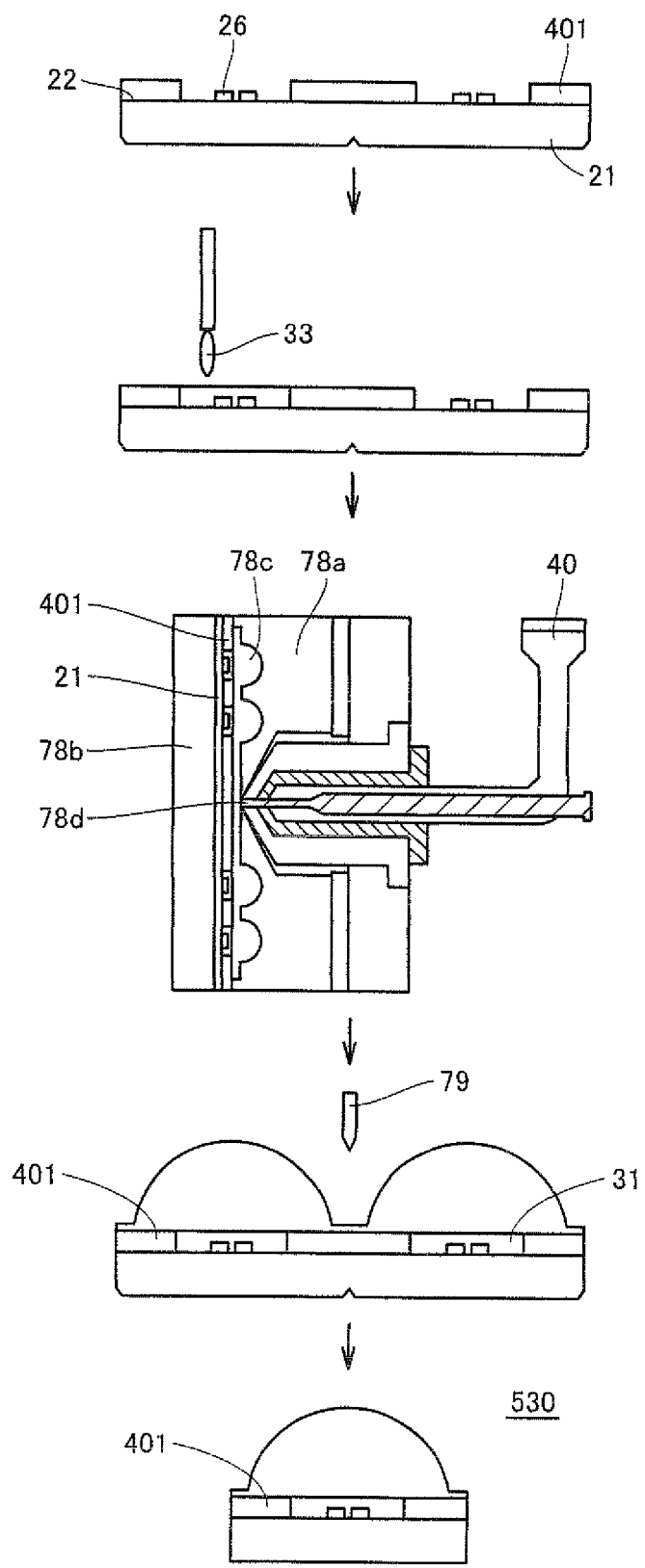
FIG. 26 is a cross-sectional view illustrating steps of a method for manufacturing a light emitting device in an eighth embodiment of the present invention.

FIG. 26 is a cross-sectional view illustrating steps of a method for manufacturing the light emitting device in an eighth embodiment of the present invention. A method for manufacturing a light emitting device 530 in the present embodiment will be described hereinafter with reference to FIG. 26. First, by using a method similar to the above method, dam sheet 401 having a high reflectivity is affixed to main surface 22 of substrate 21. Next, LED element 26 die-bonded to main surface 22 is covered with phosphor layer 31. At this time, it is important to prevent the outflow and spread of resin 33 including the fluorescent particles to a surface of dam sheet 401 when resin 33 is injected to fill the through hole.

Next, phosphor layer 31 is covered with transparent resin layer 41 in the shape of a hemispherical dome, with dam sheet 401 left. Injection molding can be used as a method for forming the hemispherical dome. Female die 78a is provided with cavity 78c formed in the shape of a hemispherical dome and a gate 78d communicating cavity 78c. Substrate 21 is set on female die 78a and clamping is performed with base die 78b. Thereafter, transparent resin 40 is injected from gate 78d into cavity 78c to cover phosphor layer 31 in the shape of a hemispherical dome. After injection of transparent resin 40, transparent resin 40 is cured within cavity 78c under the conditions of 120° C. and three minutes, and substrate 21 is removed from female die 78a. After cure is performed under the conditions of 150° C. and two hours, and then, substrate 21 is split into individual light emitting devices by using a method similar to the above method.

A material obtained by, for example, coating a surface of a fibrous sheet such as Gore-Tex® with a resin and further applying an adhesive to the other surface can be used as a material of dam sheet 401.

A comparison was made in terms of total luminous flux between light emitting device 530 in the present embodiment and a light emitting device for comparison. Light emitting device 530 has a configuration in which dam sheet 401 is affixed to ceramic substrate 21, whereas the light emitting device for comparison is not provided with dam sheet 401. The remaining configuration of light emitting device 530 in the present embodiment is equal to that of the light emitting device for comparison. Consequently, in the case of light emitting device 530, an increase in total luminous flux by 1.8 to 2.7% was recognized, as compared with the light emitting device for comparison.

According to the present embodiment, the light emitting device has a configuration in which dam sheet 401 having a high reflectivity is affixed to main surface 22, so that a resin substrate or a substrate material having a low reflectivity can be used and a high degree of flexibility in selection of the substrate material is achieved. In addition, the step of removing dam sheet 401 is not required, which simplifies the manufacturing steps.

Ninth Embodiment

In a light emitting device in the present embodiment, a dam ring is used instead of dam sheet 401. Similarly to the dam sheet, the dam ring is a component for blocking the outflow and spread of a resin including fluorescent particles to a main surface of a substrate. The light emitting device in the present embodiment is equal to the light emitting device described in the seventh embodiment other than that the light emitting device in the present embodiment includes the dam ring, and thus, the different point will be described.

Figure 27A:
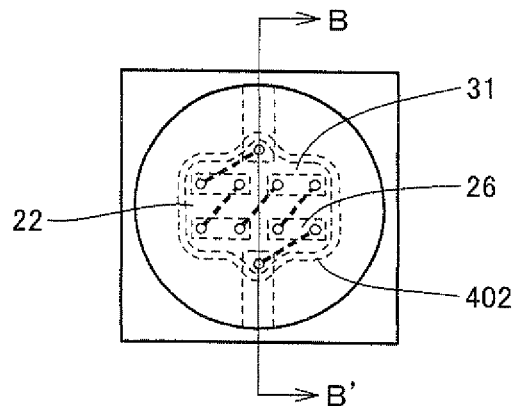
FIG. 27A is a plan view of a light emitting device in a ninth embodiment of the present invention.
Figure 27B:
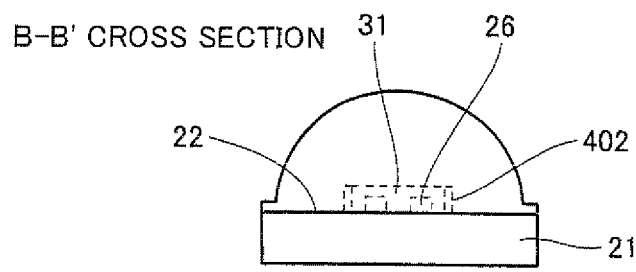
FIG. 27B is a cross-sectional view of the light emitting device in the ninth embodiment of the present invention.

FIGS. 27A and 27B illustrate the light emitting device in a ninth embodiment of the present invention. FIG. 27A is a plan view, and FIG. 27B is a cross-sectional view taken along line B-B' in FIG. 27A.

A method for manufacturing a light emitting device 540 in the present embodiment will be described hereinafter with reference to FIGS. 27A and 27B. In light emitting device 540, instead of above dam sheet 401, a dam ring 402 is affixed onto main surface 22 to surround LED element 26, and phosphor layer 31 is formed inside dam ring 402. It is noted that by using the same material as that of transparent resin layer 41 for dam ring 402, distortion of the irradiation shape due to a difference in refractive index is suppressed and a difference in expansion coefficient between dam ring 402 and transparent resin layer 41 can be eliminated. Therefore, the use of the same material as that of transparent resin layer 41 for dam ring 402 is preferable.

Figure 28:
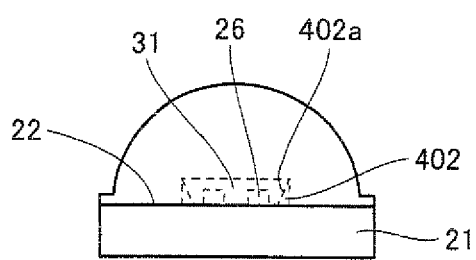
FIG. 28 is a cross-sectional view of a modification of the light emitting device in FIGS. 27A and 27B.

FIG. 28 is a cross-sectional view of a modification of the light emitting device in FIGS. 27A and 27B. Referring to FIG. 28, in a light emitting device 550 in the present modification, dam ring 402 surrounds LED element 26 with dam ring 402 affixed to main surface 22, and a wall surface of dam ring 402 has an inclined surface on a side where dam ring 402 faces LED element 26. Light emitting device 550 is characterized in that this inclined surface 402a acts as a reflection wall. As a result, forward directivity can be provided to light emitted from light emitting device 550. It is noted that a material having a high reflectivity of inclined surface 402a is preferably used as the material of dam ring 402, and metal, a resin having a reflective film formed, or the like can be used.

Tenth Embodiment

In the present embodiment, a light emitting device using the structure of light emitting device 520 in FIGS. 25A to 25C, as well as a surface lighting device and a liquid crystal display device using this light emitting device will be described. In the following, description of the overlapping structure will not be repeated, and the different structure in comparison with light emitting device 520 in FIGS. 25A to 25C will be mainly described.

Figure 29:
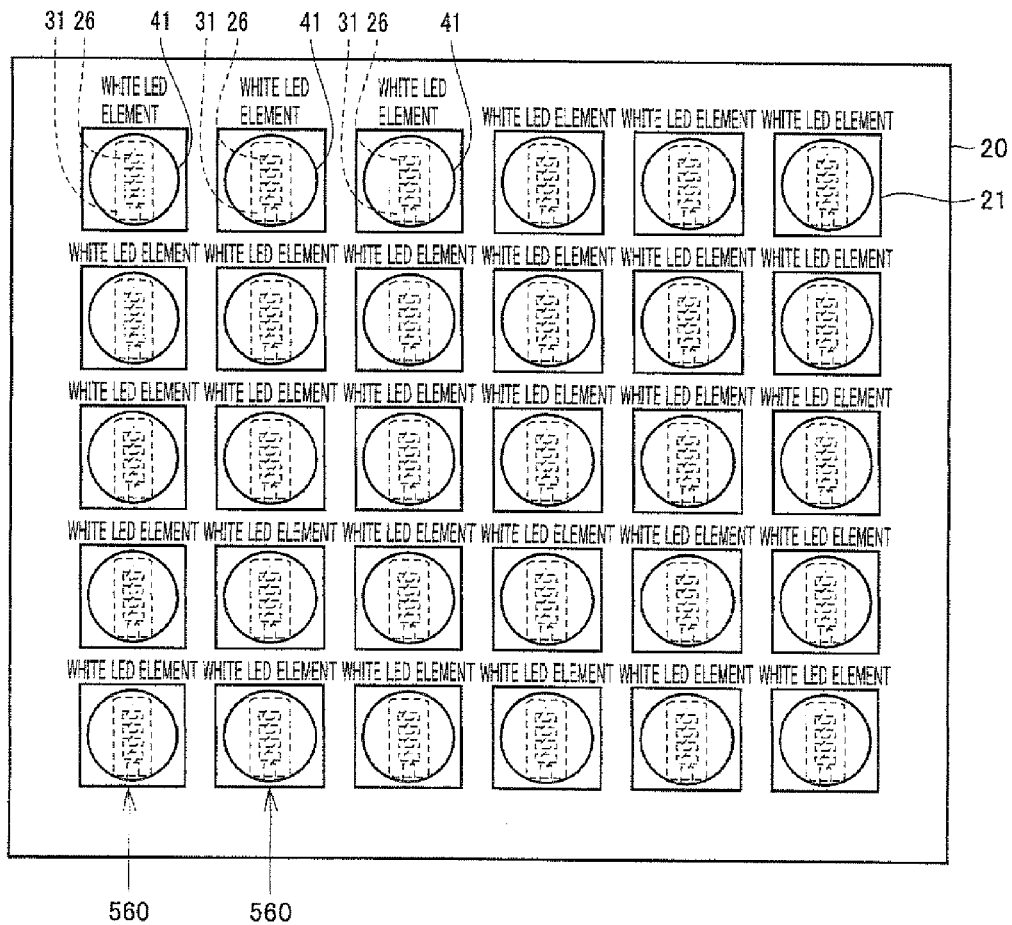
FIG. 29 is a plan view of a light emitting device in a tenth embodiment of the present invention.
Figure 30:
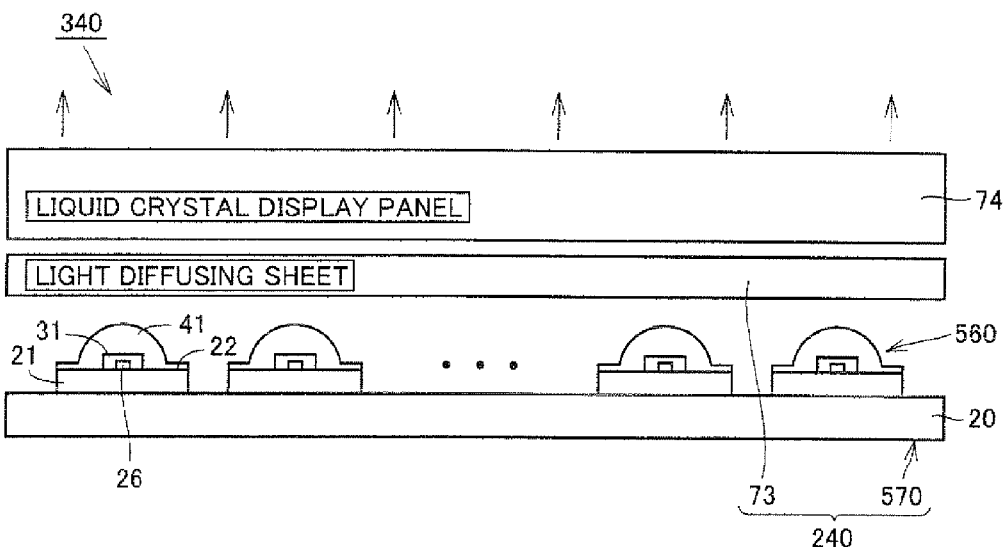
FIG. 30 is a cross-sectional view of a surface lighting device and a liquid crystal display device using the light emitting device in FIG. 29.

FIG. 29 is a plan view of the light emitting device in a tenth embodiment of the present invention. FIG. 30 is a cross-sectional view of the surface lighting device and the liquid crystal display device using the light emitting device in FIG. 29.

Referring to FIGS. 29 and 30, in the present embodiment, a surface light source 570 is configured by arranging and installing a plurality of light emitting devices 560 having the same form as that of light emitting device 520 shown in FIGS. 25A to 25C, on housing substrate 20 in the shape of a two-dimensional matrix. A blue LED element is used as LED element 26 in light emitting device 560 and a resin layer including only a yellow phosphor or a green phosphor and a red phosphor is used as phosphor layer 31, so that the light emitting device that emits white light is configured.

It is noted that the number of installed LED elements 26 is not limited to four. Other number of LED elements, such as three LED elements may be installed. In addition, the arrangement of light emitting device 560 on the housing substrate is not limited to the present arrangement form. The arrangement form in the hexagonal shape, the triangular shape or the like may be taken, for example.

Surface lighting device 240 in the present embodiment is used for liquid crystal display device 340 as a directly below type backlight. Surface lighting device 240 has surface light source 570 including the plurality of light emitting devices 560, and light diffusing sheet 73. Light diffusing sheet 73 is positioned with respect to surface light source 570 to face main surface 22 of substrate 21 of each light emitting device 560.

Liquid crystal display device 340 is configured to have liquid crystal display panel 74 in addition to surface lighting device 240. Liquid crystal display panel 74 is arranged on a side of light diffusing sheet 73 opposite to surface light source 570. It is noted that an optical lens component may be disposed instead of light diffusing sheet 73 in order to improve unevenness of luminance and chromaticity of surface lighting device 240. Alternatively, an optical sheet having the light collection function may be inserted between light diffusing sheet 73 and liquid crystal display panel 74.

According to the light emitting device, the surface lighting device and the liquid crystal display device in the tenth embodiment of the present invention configured as described above, the effect described in the third embodiment can be obtained similarly.

It should be understood that the embodiments disclosed herein are illustrative and not limitative in any respect. The scope of the present invention is defined by the terms of the claims, rather than the above description, and is intended to include any modifications within the scope and meaning equivalent to the terms of the claims.

INDUSTRIAL APPLICABILITY

The present invention is mainly used for a backlight for a display device such as a liquid crystal television.

DESCRIPTION OF THE REFERENCE SIGNS 10, 10', 110, 120, 130, 140, 170, 180, 190, 200, 510, 520, 530, 540, 550, 560 light emitting device; 21 substrate; 22 main surface; 26 LED element; 31 phosphor layer; 31m inner phosphor layer; 31n outer phosphor layer; 33 resin including fluorescent particles; 36 fluorescent particles; 41 transparent resin layer; 42 outer circumferential surface; 46 atmospheric layer; 61, 66 light guide plate; 62 incidence end surface; 63, 67 emission surface; 68 incidence surface; 74 liquid crystal display panel; 101 circumference; 210, 220, 230, 240 surface lighting device; 310, 320, 330, 340 liquid crystal display device; 401 dam sheet; 402 dam ring

The invention claimed is:

1. A light emitting device, comprising:
a substrate having a main surface;
an inner portion provided on said main surface and containing a semiconductor light emitting element that emits primary light and a fluorescent particle that absorbs a part of the primary light and emits secondary light;
an outer portion having a refractive index n and covering said inner portion, wherein
said outer portion has an outer circumferential surface exposed to the atmosphere,
when a minimum spherical circumference that includes overall said inner portion and is concentric with said outer circumferential spherical surface has a radius r in a cut surface where at least a part of said outer circumferential spherical surface takes a shape of an arc having a radius R, a relationship of $R > r \cdot n$ is satisfied;
wherein said outer portion is formed of a single transparent layer;
said inner portion is a phosphor layer containing said fluorescent particle, and said phosphor layer is provided to be in direct contact with said semiconductor light emitting element and directly cover said semiconductor light emitting element; and
wherein said fluorescent particle is provided only in said inner portion, of said inner portion and said outer portion.

2. The light emitting device according to claim 1, wherein said inner portion contains a plurality of said semiconductor light emitting elements.

3. The light emitting device according to claim 1, further comprising
a scattered particle dispersed in said inner portion, for scattering the primary light and the secondary light.

4. The light emitting device according to claim 1, wherein said outer portion and said inner portion are formed in a shape of concentric hemispheres having radius R and radius r ($r < R/n$), respectively.

5. The light emitting device according to claim 1, wherein said outer portion and said inner portion are formed in a shape of concentric semicircles having radius R and radius r (r<R/n) in said cut surface, respectively, and the outer circumferential surface of said outer portion has a shape of a semicircular column.

6. The light emitting device according to claim 1, wherein a center of said outer circumferential surface and said circumference is arranged on said main surface or within said substrate.

7. The light emitting device according to claim 1, wherein said inner portion has any one of a rectangular parallelepiped shape, a columnar shape and a polygonal columnar shape.

8. The light emitting device according to claim 1, wherein when said inner portion has a refractive index n', a relationship of n<n' is satisfied.

9. The light emitting device according to claim 1, wherein said inner portion is formed of a transparent resin or glass.

10. The light emitting device according to claim 1, wherein
said outer portion is formed of a transparent resin or glass.

11. The light emitting device according to claim 1, further comprising
a blocking component provided at a boundary portion between said inner portion and said outer portion on said main surface.

12. A surface light source, comprising:
a line light source having a plurality of light emitting devices according to claim 1 arranged in a straight line; and
a light guide plate having an emission surface that extends in a planar shape and an incidence end surface that extends in a thickness direction of the light guide plate from a periphery of said emission surface and on which light emitted from said line light source is incident, and
upon reception of the light incident on said incidence end surface, light being emitted from said emission surface.

13. A liquid crystal display device, comprising:
the surface light source according to claim 12; and
a liquid crystal display panel arranged to face said surface light source and irradiated from a rear surface by said surface light source.

14. A surface light source, comprising a plurality of light emitting devices according to claim 1 arranged in a planar shape.

15. A liquid crystal display device, comprising:
the surface light source according to claim 14; and
a liquid crystal display panel arranged to face said surface light source and irradiated from a rear surface by said surface light source.

* * * * *